US011728092B2

(12) United States Patent
Berolini et al.

(10) Patent No.: US 11,728,092 B2
(45) Date of Patent: *Aug. 15, 2023

(54) MULTILAYER CERAMIC CAPACITOR HAVING ULTRA-BROADBAND PERFORMANCE

(71) Applicant: KYOCERA AVX Components Corporation, Fountain Inn, SC (US)

(72) Inventors: Marianne Berolini, Greenville, SC (US); Jeffrey A. Horn, Simpsonville, SC (US); Richard C. VanAlstine, Piedmont, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/541,337

(22) Filed: Dec. 3, 2021

(65) Prior Publication Data

US 2022/0093332 A1 Mar. 24, 2022

Related U.S. Application Data

(63) Continuation of application No. 16/751,323, filed on Jan. 24, 2020, now Pat. No. 11,195,656.

(Continued)

(51) Int. Cl.
*H01G 4/012* (2006.01)
*H01G 4/12* (2006.01)
(Continued)

(52) U.S. Cl.
CPC ........... *H01G 4/012* (2013.01); *H01G 4/1227* (2013.01); *H01G 4/2325* (2013.01); *H01G 4/30* (2013.01)

(58) Field of Classification Search
CPC ........ H01G 4/012; H01G 4/12; H01G 4/1218; H01G 4/1227; H01G 4/232; H01G 4/2325;
(Continued)

(56) References Cited

U.S. PATENT DOCUMENTS 5,021,921 A 6/1991 Sano et al.
5,719,539 A 2/1998 Ishizaki et al.
(Continued)

FOREIGN PATENT DOCUMENTS

EP 0 929 087 B1 5/2007
JP H 066105 A 1/1994
(Continued)

OTHER PUBLICATIONS

AVX Product Information on Flexisafe MLC Chips, 2017, 1 pages.
(Continued)

*Primary Examiner* — Nathan Milakovich
(74) *Attorney, Agent, or Firm* — Dority & Manning, P.A.

(57) ABSTRACT

A broadband multilayer ceramic capacitor may include a monolithic body including a plurality of dielectric layers stacked in the Z-direction, a first external terminal, and a second external terminal. A plurality of active electrodes, a bottom shield electrode, and a top shield electrode may be arranged within the monolithic body. The top shield electrode may be positioned between the active electrodes and a top surface of the capacitor and spaced apart from the top surface of the capacitor by a top-shield-to-top distance. A bottom shield electrode may be positioned between the active electrodes and the bottom surface of the capacitor and spaced apart from the bottom surface of the capacitor by a bottom-shield-to-bottom distance. A ratio of the top-shield-to-top distance to the bottom-shield-to-bottom distance may be between about 0.8 and about 1.2. The bottom-shield-to-
(Continued)

bottom distance may range from about 8 microns to about 100 microns.

21 Claims, 18 Drawing Sheets

Related U.S. Application Data

(60) Provisional application No. 62/797,532, filed on Jan. 28, 2019.

(51) Int. Cl.
*H01G 4/30* (2006.01)
*H01G 4/232* (2006.01)

(58) Field of Classification Search
CPC . H01G 4/30; H01G 4/35; H01G 2/065; G01R 31/64
See application file for complete search history.

(56) References Cited

U.S. PATENT DOCUMENTS

| | | | |
|---|---|---|---|
| 6,020,799 A | 2/2000 | Ishizaki et al. | |
| 6,304,156 B1 | 10/2001 | Ishizaki et al. | |
| 6,310,759 B2 | 10/2001 | Ishigaki et al. | |
| 6,587,327 B1 | 7/2003 | Devoe et al. | |
| 6,771,485 B2 | 8/2004 | Yokoyama et al. | |
| 6,816,356 B2 | 11/2004 | Devoe et al. | |
| 6,970,341 B1 | 11/2005 | Devoe et al. | |
| 7,068,124 B2 | 6/2006 | White et al. | |
| 7,085,124 B2 | 8/2006 | Togashi | |
| 7,115,302 B2 | 10/2006 | Yokoyama et al. | |
| 7,177,137 B2 | 2/2007 | Ritter et al. | |
| 7,265,964 B1 | 9/2007 | Togashi | |
| 7,318,868 B2 | 1/2008 | Yokoyama et al. | |
| 7,336,475 B2 | 2/2008 | Bultitude et al. | |
| 7,334,981 B2 | 3/2008 | Ritter et al. | |
| 7,463,474 B2 | 12/2008 | Ritter et al. | |
| 7,675,729 B2 | 3/2010 | Anthony et al. | |
| 7,715,173 B2 | 5/2010 | Bultitude et al. | |
| 7,843,679 B2 | 11/2010 | Togashi | |
| 7,859,821 B2 | 12/2010 | Shimizu | |
| 8,446,705 B2 | 5/2013 | Ritter et al. | |
| 8,576,538 B2 | 11/2013 | Kuroda et al. | |
| 8,780,523 B2 | 7/2014 | Seo et al. | |
| 8,885,319 B2 | 11/2014 | Bultitude et al. | |
| 9,087,648 B2 | 7/2015 | Bultitude et al. | |
| 9,418,789 B2 | 8/2016 | Lee et al. | |
| 9,490,072 B2 | 11/2016 | Bultitude et al. | |
| 9,786,436 B2 | 10/2017 | Itamural | |
| 9,799,449 B2 | 10/2017 | Hill et al. | |
| 9,812,259 B2 | 11/2017 | Lee et al. | |
| 9,843,299 B2 | 12/2017 | Ahn et al. | |
| 9,847,173 B2 | 12/2017 | Taniguchi et al. | |
| 9,893,703 B2 | 2/2018 | Ahn et al. | |
| 9,899,151 B2 | 2/2018 | Itamura | |
| 9,997,295 B2 | 6/2018 | Fujita et al. | |
| 10,083,795 B2 | 9/2018 | Itamura | |
| 10,304,629 B2 | 5/2019 | Kitamura et al. | |
| 10,943,735 B2 | 3/2021 | Horn et al. | |
| 11,195,656 B2* | 12/2021 | Berolini | H01G 4/30 |
| 11,361,907 B2* | 6/2022 | Berolini | H01G 4/12 |
| 2005/0248908 A1 | 11/2005 | Dreezen et al. | |
| 2010/0039749 A1* | 2/2010 | Ritter | H01G 4/30 29/25.42 |
| 2012/0154977 A1 | 6/2012 | Hur et al. | |
| 2012/0297596 A1 | 11/2012 | Bultitude et al. | |
| 2018/0374646 A1* | 12/2018 | Ward | H01G 4/30 |
| 2019/0279819 A1 | 9/2019 | Horn et al. | |
| 2020/0243259 A1 | 7/2020 | Berolini et al. | |
| 2020/0243260 A1 | 7/2020 | Berolini et al. | |
| 2020/0243264 A1 | 7/2020 | Berolini et al. | |
| 2020/0243265 A1 | 7/2020 | Berolini et al. | |
| 2020/0343046 A1 | 10/2020 | Hodgkinson et al. | |
| 2022/0293348 A1* | 9/2022 | Berolini | H01G 2/065 |

FOREIGN PATENT DOCUMENTS

| | | |
|---|---|---|
| JP | H 10275745 A | 10/1998 |
| JP | 2002343677 A | 11/2002 |
| JP | 2012138391 A | 7/2012 |
| JP | 2015070144 A | 4/2015 |
| WO | WO 2014139696 A1 | 9/2014 |

OTHER PUBLICATIONS

Johnson et al., "Nonlinear Acoustic Effects in Multilayer Ceramic Capacitors," *Nations Institute of Standards and Technology*, Jan. 2013, 9 pages.
KEMET Electronics Corporation—Surface Mount Multilayer Ceramic Chip Capacitors (SMD MLCCs), Open Mode Design (FO-CAP), X7R Dielectric 16-200 VDC (Commercial and Automotive Grade), Sep. 9, 2019, 25 pages.
KEMET Corporation—KEMET Introduces FO-CAP Combining Flexible Termination With Open Mode Chip Design Technology, Aug. 2, 2011, 3 pages.
Keimasai et al., "Flex Cracking of Multilayer Ceramic Capacitors Assembled with Pb-Free and Tin-Lead Solders," *IEEE Transactions on Device and Materials Reliability*, vol. 8, No. 1, Mar. 2008, pp. 182-192.
Keimasi, Mohammadreza (Doctorate)—"Flex Cracking and Temperature-Humidity-Bias Effects on Reliability of Multilayer Ceramic Capacitors," 2007, 181 pages.
Liu, et al., "Reliability Evaluation of Base-Metal-Electrode Multilayer Ceramic Capacitors for Potential Space Applications," *Materials Science*, 2011, 19 pages (nepp,nasa.gov).
Prymak et al., "New Improvements in Flex Capabilities for MLC Chip Capacitors," *2006 CARTS Conference*, Apr. 3-6, Components Technology Institute, Inc., 11 pages.
Sloka et al., "Flexure Robust Capacitors," Kemet, Jan. 2007, 12 pages.
Watkins, James Robert (Doctorate)—"Evaluating the Susceptibility of Electronic Components Assembled with Leaded Solder to Flexural Failures, with High Rate Considerations," 2008, 126 pages.
International Search Report and Written Opinion for PCT/US2020/014892 dated May 20, 2020, 12 pages.
Chinese Search Report for CN Application No. 202080010338.9 dated Apr. 8, 2022, 2 pages.

\* cited by examiner

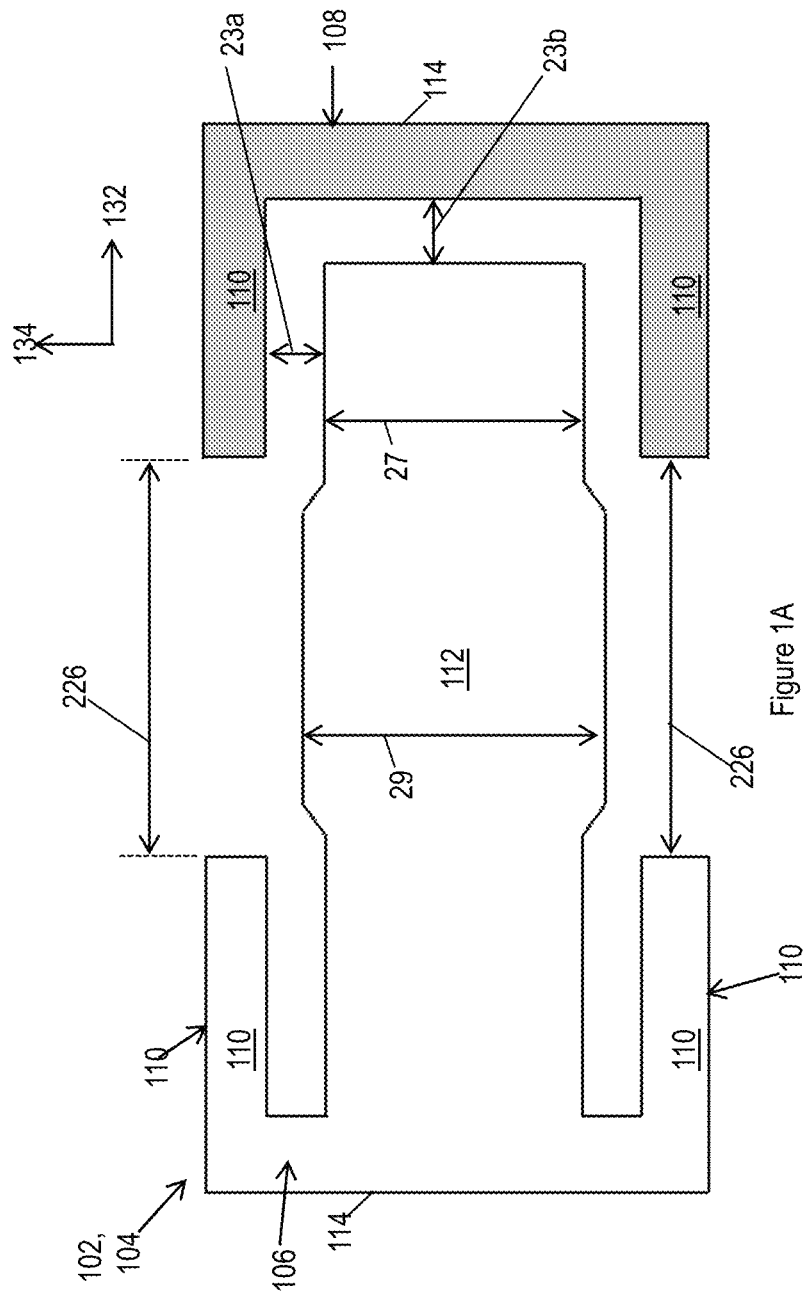

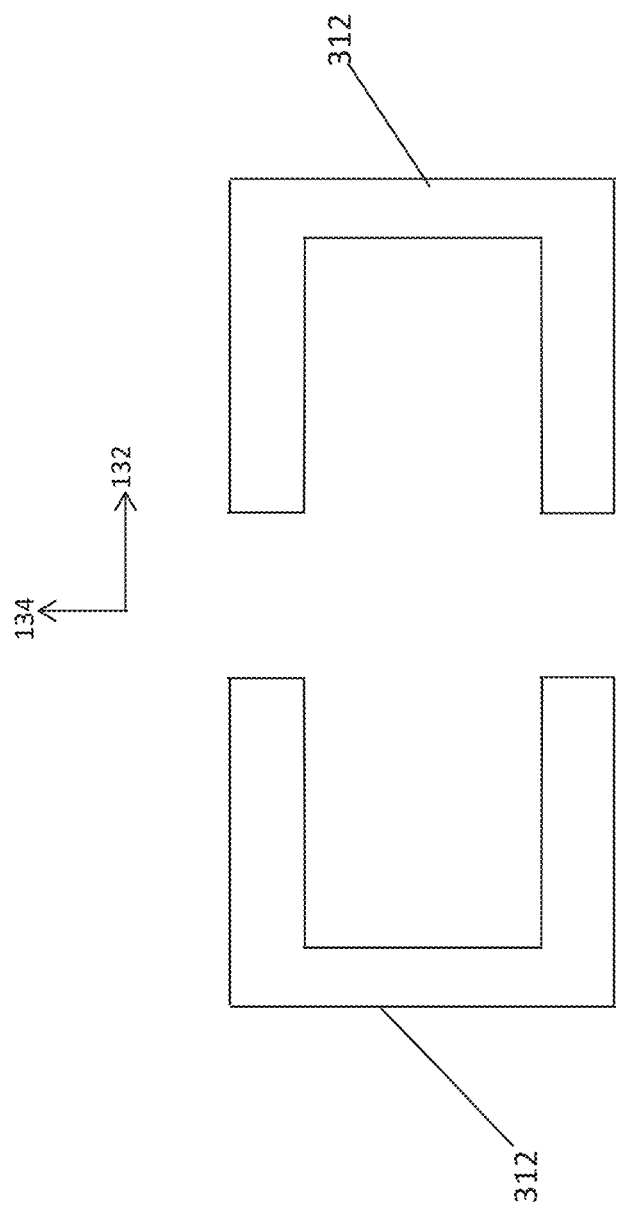

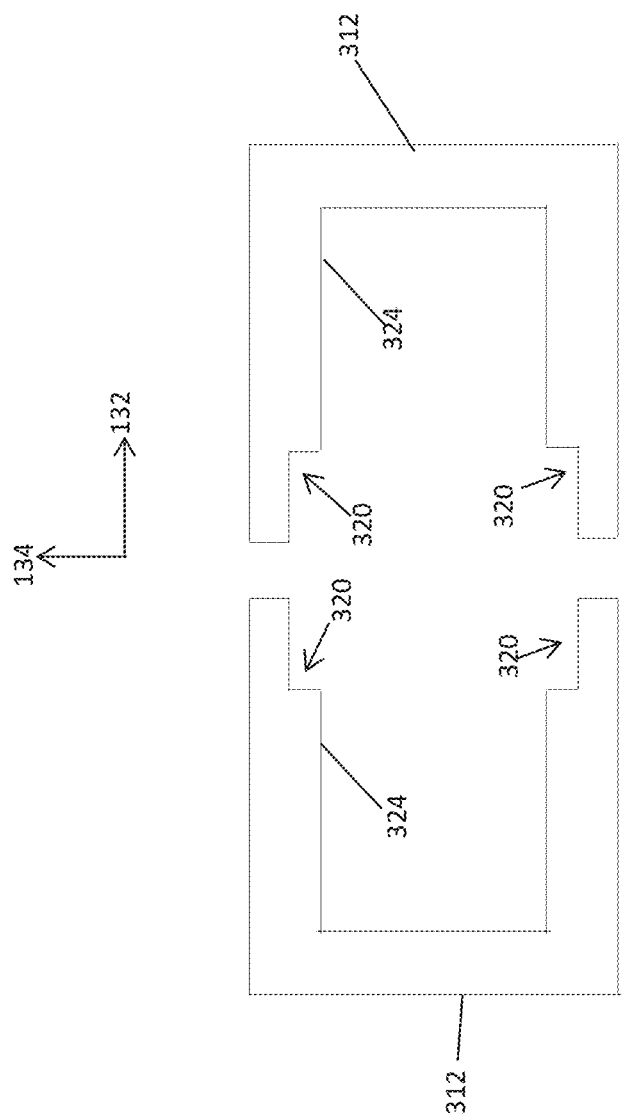

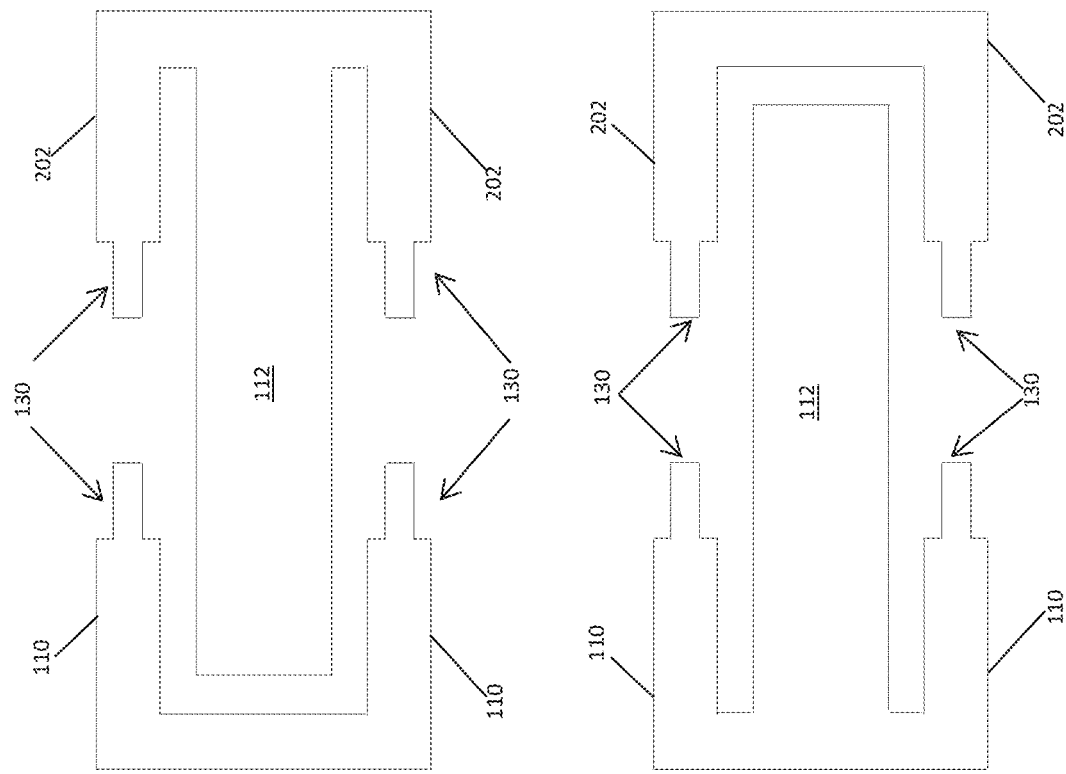

MULTILAYER CERAMIC CAPACITOR HAVING ULTRA-BROADBAND PERFORMANCE

CROSS REFERENCE TO RELATED APPLICATIONS

The present application is a continuation of U.S. application Ser. No. 16/751,323 having a filing date of Jan. 24, 2020, which claims filing benefit of U.S. Provisional Patent Application Ser. No. 62/797,532 having a filing date of Jan. 28, 2019, which are incorporated herein by reference in their entirety.

BACKGROUND OF THE INVENTION

The diversity of modern technical applications creates a need for efficient electronic components and integrated circuits for use therein. Capacitors are a fundamental component used for filtering, coupling, bypassing and other aspects of such modern applications which may include wireless communications, alarm systems, radar systems, circuit switching, matching networks, and many other applications. A dramatic increase in the speed and packing density of integrated circuits requires advancements in coupling capacitor technology in particular. When high-capacitance coupling capacitors are subjected to the high frequencies of many present applications, performance characteristics become increasingly more important. Because capacitors are fundamental to such a wide variety of applications, their precision and efficiency is imperative. Many specific aspects of capacitor design have thus been a focus for improving their performance characteristics.

SUMMARY OF THE INVENTION

In accordance with one embodiment of the present invention, a broadband multilayer ceramic capacitor may have a first end and a second end that is spaced apart from the first end in a longitudinal direction that is perpendicular to a lateral direction. The lateral direction and longitudinal direction may each be perpendicular to a Z-direction. The capacitor may include a top surface and a bottom surface that is opposite the top surface in the Z-direction. The broadband multilayer ceramic capacitor may include a monolithic body comprising a plurality of dielectric layers stacked in the Z-direction. The broadband multilayer ceramic capacitor may include a first external terminal disposed along the first end and a second external terminal disposed along the second end. The broadband multilayer ceramic capacitor may include a plurality of active electrodes arranged within the monolithic body. The broadband multilayer ceramic capacitor may include a top shield electrode arranged within the monolithic body and positioned between the plurality of active electrodes and the top surface of the capacitor. The first shield electrode may be spaced apart from the top surface of the capacitor by a top-shield-to-top distance. The broadband multilayer ceramic capacitor may include a bottom shield electrode arranged within the monolithic body and positioned between the plurality of active electrodes and the bottom surface of the capacitor. The bottom shield electrode may be spaced apart from the bottom surface of the capacitor by a bottom-shield-to-bottom distance. A ratio of the top-shield-to-top distance to the bottom-shield-to-bottom distance may be between about 0.8 and about 1.2. The bottom-shield-to-bottom distance may range from about 8 microns to about 100 microns.

In accordance with another embodiment of the present invention, a method of forming a broadband multilayer ceramic capacitor is disclosed. The broadband multilayer ceramic capacitor may have a first end and a second end that is spaced apart from the first end in a longitudinal direction that is perpendicular to a lateral direction. The lateral direction and longitudinal direction may each be perpendicular to a Z-direction. The capacitor may have a top surface and a bottom surface opposite the top surface in the Z-direction. The method may include forming a plurality of active electrodes on a plurality of active electrode layers; forming a top shield electrode on a top shield electrode layer; forming a bottom shield electrode on a bottom shield electrode layer; and stacking the plurality of active electrode layers, the top shield electrode layer, and the bottom shield electrode layer with a plurality of dielectric layers to form a monolithic body; forming a first external termination on a first end of the monolithic body; and forming a second external termination on a second end of the monolithic body. The top shield electrode layer may be arranged within the monolithic body and positioned between the plurality of active electrodes layers and the top surface of the capacitor. The top shield electrode may be spaced apart from the top surface of the capacitor by a top-shield-to-top distance. The bottom shield electrode layer may be arranged within the monolithic body and positioned between the plurality of active electrodes and the bottom surface of the capacitor. The bottom shield electrode may be spaced apart from the bottom surface of the capacitor by a bottom-shield-to-bottom distance. A ratio of the top-shield-to-top distance to the bottom-shield-to-bottom distance may be between about 0.8 and about 1.2. The bottom-shield-to-bottom distance may range from about 8 microns to about 100 microns.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which:

FIG. 1A illustrates a top view of one embodiment of an active electrode layer according to aspects of the present disclosure;

FIG. 6A through 6D illustrate top views of anchor electrodes, shield electrodes, and active electrodes of the capacitor of FIG. 5 in accordance with one embodiment of the present invention; and FIGS. 7A through 7D illustrate top views of additional embodiments of anchor electrodes in accordance with certain embodiments of the present invention.

DETAILED DESCRIPTION OF THE PREFERRED EMBODIMENTS

Figure 1B:
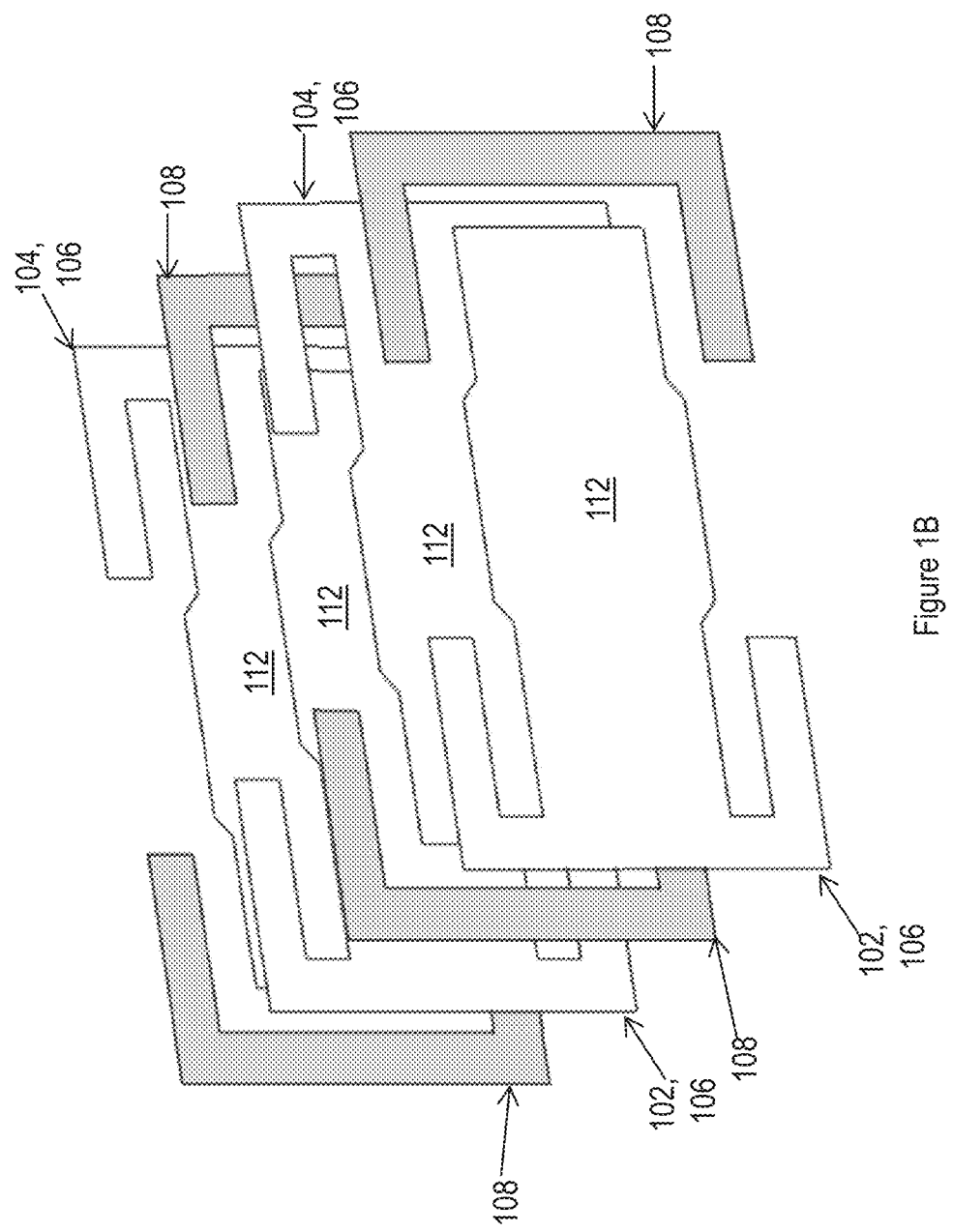
FIG. 1B illustrates a perspective view of alternating electrode layers configured as shown in FIG. 1A according to aspects of the present disclosure.

It is to be understood by one of ordinary skill in the art that the present discussion is a description of exemplary embodiments only, and is not intended as limiting the broader aspects of the present invention.

Generally speaking, the present invention is directed to a multilayer ceramic capacitor. The multilayer ceramic capacitor contains alternating dielectric layers and electrode layers within a single, monolithic body. The capacitor includes a plurality of active electrodes, a top shield electrode, and a bottom shield electrode arranged within the monolithic body. The top shield electrode is positioned between the plurality of active electrodes and a top surface of the capacitor and spaced apart from the top surface of the capacitor by a top-shield-to-top distance. The bottom shield electrode is positioned between the plurality of active electrodes and a bottom surface of the capacitor and spaced apart from the bottom surface of the capacitor by a bottom-shield-to-bottom distance.

A ratio of the top-shield-to-top distance to the bottom-shield-to-bottom distance may range from about 0.8 to about 1.2, in some embodiments from about 0.9 to about 1.1, in some embodiments from about 0.95 to about 1.05, and in some embodiments from about 0.98 to about 1.02.

The bottom-shield-to-bottom distance may range from about 8 microns to about 100 microns, in some embodiments from about 9 microns to about 75 microns, in some embodiments from about 10 microns to about 65 microns, and in some embodiments from about 11 microns to about 30 microns.

The present inventors have discovered that such distances can provide a multilayer ceramic capacitor with a low insertion loss across a broad range of frequencies. In general, the insertion loss is the loss of power through the capacitor and may be measured using any method generally known in the art.

For instance, the insertion loss may be about −0.3 dB or more, such as about −0.28 dB or greater, such as about −0.25 dB or more, such as about −0.23 dB or more when measured across a frequency range of from 4 GHz to 10 GHz.

The insertion loss may be about −0.4 dB or more, such as about −0.38 dB or more, such as about −0.35 dB or more, such as about −0.34 dB or more when measured across a frequency range of from 13 GHz to 20 GHz.

The insertion loss may be about −0.45 dB or more, such as about −0.4 dB or more, such as about −0.38 dB or more, such as about −0.35 dB or more, such as about −0.32 dB or more when measured across a frequency range of from 23 GHz to 30 GHz.

The insertion loss may be about −0.55 dB or more, such as about −0.5 dB or more, such as about −0.48 dB or more, such as about −0.45 dB or more, such as about −0.43 dB or more when measured across a frequency range of from 33 GHz to 40 GHz.

The bottom-shield-to-bottom distance may be defined as a distance between the shield electrodes and the bottom surface of the capacitor. If multiple shield electrode layers are included, the bottom-shield-to-bottom may be defined as the distance between the lowest of the shield electrode layers and the bottom surface. A ratio of the capacitor thickness to the bottom-shield-to-bottom distance may greater than about 3, in some embodiments greater than about 5, in some embodiments, in some embodiments greater than about 10, in some embodiments greater than about 15, in some embodiments greater than about 20, and in some embodiments greater than about 40. The bottom-shield-to-bottom distance may range from about 3 microns to about 100 microns, in some embodiments from about 4 microns to about 75 microns, in some embodiments from about 5 microns to about 60 microns, and in some embodiments from about 8 microns to about 30 microns.

The capacitor may include a plurality of electrode regions that include an active electrode region, a top shield electrode region, and a bottom shield electrode region. The plurality of active electrodes may be located within the shield electrode region. The top shield electrode may be located within the top shield electrode region. The bottom shield electrode may be located within the bottom shield electrode region.

A ratio of a thickness of the top shield electrode region in the Z-direction to a thickness of the bottom shield electrode region in the Z-direction may range from about 0.8 to about 1.2, in some embodiments from about 0.9 to about 1.1, in some embodiments from about 0.95 to about 1.05, and in some embodiments from about 0.98 to about 1.02.

The capacitor may include a first external terminal disposed along a first end of the capacitor and a second external terminal that is disposed along a second end of the capacitor. An additional bottom shield electrode may be approximately aligned with the bottom shield electrode in the Z-direction. The bottom shield electrode may be connected with the first external terminal, and the additional bottom shield electrode may be connected with the second external terminal.

The shield electrodes may have a variety of shapes. For example, in some embodiments the bottom shield electrode may define a step feature between two longitudinal edges. The bottom shield electrode may have a first longitudinal edge and a second longitudinal edge that are each aligned with the lateral direction and facing away from the first external terminal. The second longitudinal edge may be offset in the longitudinal direction from the first longitudinal edge by a shield electrode offset distance. However, in some embodiments one or more of the shield electrodes may be rectangular without any step features. Additionally, one or more of the shield electrodes (e.g., the bottom shield electrode(s) and/or top shield electrode(s)) may be symmetric in the lateral direction about a longitudinal centerline that extends in the longitudinal direction.

The additional bottom shield electrode, which may be connected with the second external terminal and approximately aligned with the bottom shield electrode in the Z-direction may similarly have a step feature. More specifically, a first longitudinal edge may be aligned with the lateral direction and face away from the second external terminal and a second longitudinal edge aligned with the lateral direction and face away from the second external terminal. The second longitudinal edge may be offset in the longitudinal direction from the first longitudinal edge by approximately the shield electrode offset distance A first shield gap distance may be formed in the longitudinal direction between the first longitudinal edge of the bottom shield electrode and the first longitudinal edge of the additional bottom shield electrode. The capacitor may have a capacitor length in the longitudinal direction between the first end and the second end of the capacitor. A ratio of the capacitor length to the first shield gap distance may be greater than about 2, in some embodiments greater than about 3, in some embodiments greater than about 4, in some embodiments greater than about 5, in some embodiments greater than about 10, in some embodiments greater than about 15, in some embodiments greater than about 20, and in some embodiments greater than about 50.

A second shield gap distance may be formed in the longitudinal direction between the second longitudinal edge of the bottom shield electrode and the second longitudinal edge of the additional bottom shield electrode. A ratio of the capacitor length to the second shield gap distance may be greater than about 2, in some embodiments greater than about 3, in some embodiments greater than about 4, in some embodiments greater than about 5, in some embodiments greater than about 10, in some embodiments greater than about 15, in some embodiments greater than about 20, and in some embodiments greater than about 50.

The first shield gap distance and/or second shield gap distance may range from about 10 microns to about 200 microns, in some embodiments from about 20 microns to about 150 microns, and in some embodiments from about 30 microns to about 80 microns.

The shield electrode offset distance may range from about 75 microns to about 300 microns, in some embodiments from about 100 microns to about 250 microns, and in some embodiments from about 125 microns to about 175 microns.

The broadband multilayer ceramic capacitor may have a capacitor thickness in the Z-direction between the top surface and the bottom surface. A ratio of the capacitor thickness to a thickness of the top shield electrode region in the Z-direction may range from about 2.1 to about 20, in some embodiments from about 2.2 to about 10, in some embodiments from about 2.5 to about 7, in some embodiments from about 2.7 to about 6, and in some embodiments from about 3 to about 5. A ratio of the capacitor thickness to a thickness of the bottom shield electrode region in the Z-direction may range from about 2.1 to about 20, in some embodiments from about 2.2 to about 10, in some embodiments from about 2.5 to about 7, in some embodiments from about 2.7 to about 6, and in some embodiments from about 3 to about 5.

A ratio of the capacitor thickness to an active electrode region thickness may range from about 1.1 to about 20, in some embodiments from about 1.5 to about 15, in some embodiments from about 1.7 to about 12, in some embodiments from about 2 to about 10, and in some embodiments from about 3 to about 7.

In general, the capacitor includes alternating dielectric layers and electrode layers, which may form at least a part of the monolithic body of the capacitor. By arranging the dielectric layers and the electrode layers in a stacked or laminated configuration, the capacitor may be referred to as a multilayer capacitor and in particular a multilayer ceramic capacitor, for instance when the dielectric layers comprise a ceramic.

The shield electrode region may have a shield electrode region thickness in the Z-direction. The shield electrode region thickness may be defined between the bottom surface of the capacitor and a lowest electrode layer of the plurality of active electrodes. A ratio of the capacitor thickness to the shield electrode region thickness may range from about 1.1 to about 20, in some embodiments from about 1.5 to about 10, in some embodiments from about 1.7 to about 5.

I. Example Embodiments

Figure 1C:
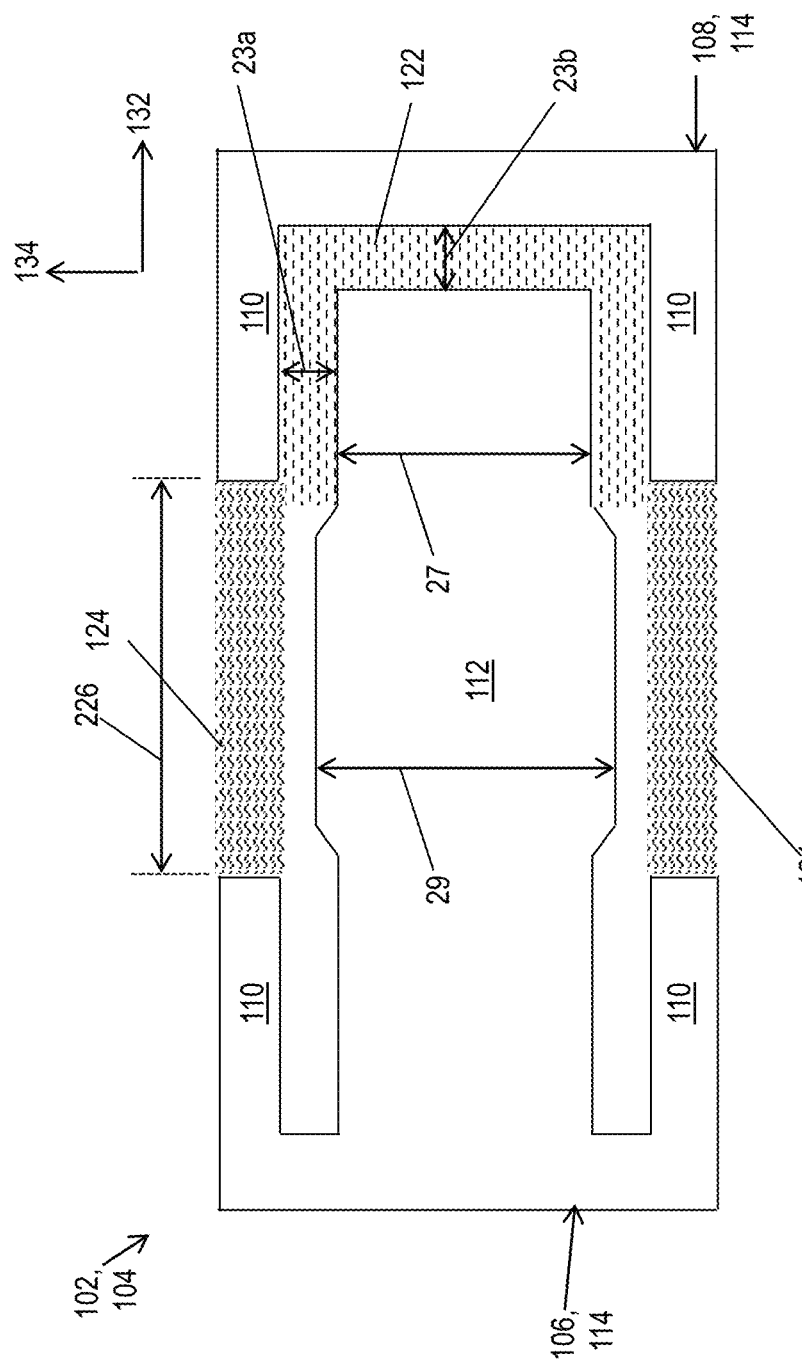
FIG. 1C illustrates a top down view of the embodiment of the active electrode layer of FIG. 1A in which multiple capacitive regions are formed according to aspects of the present disclosure.
Figure 1D:
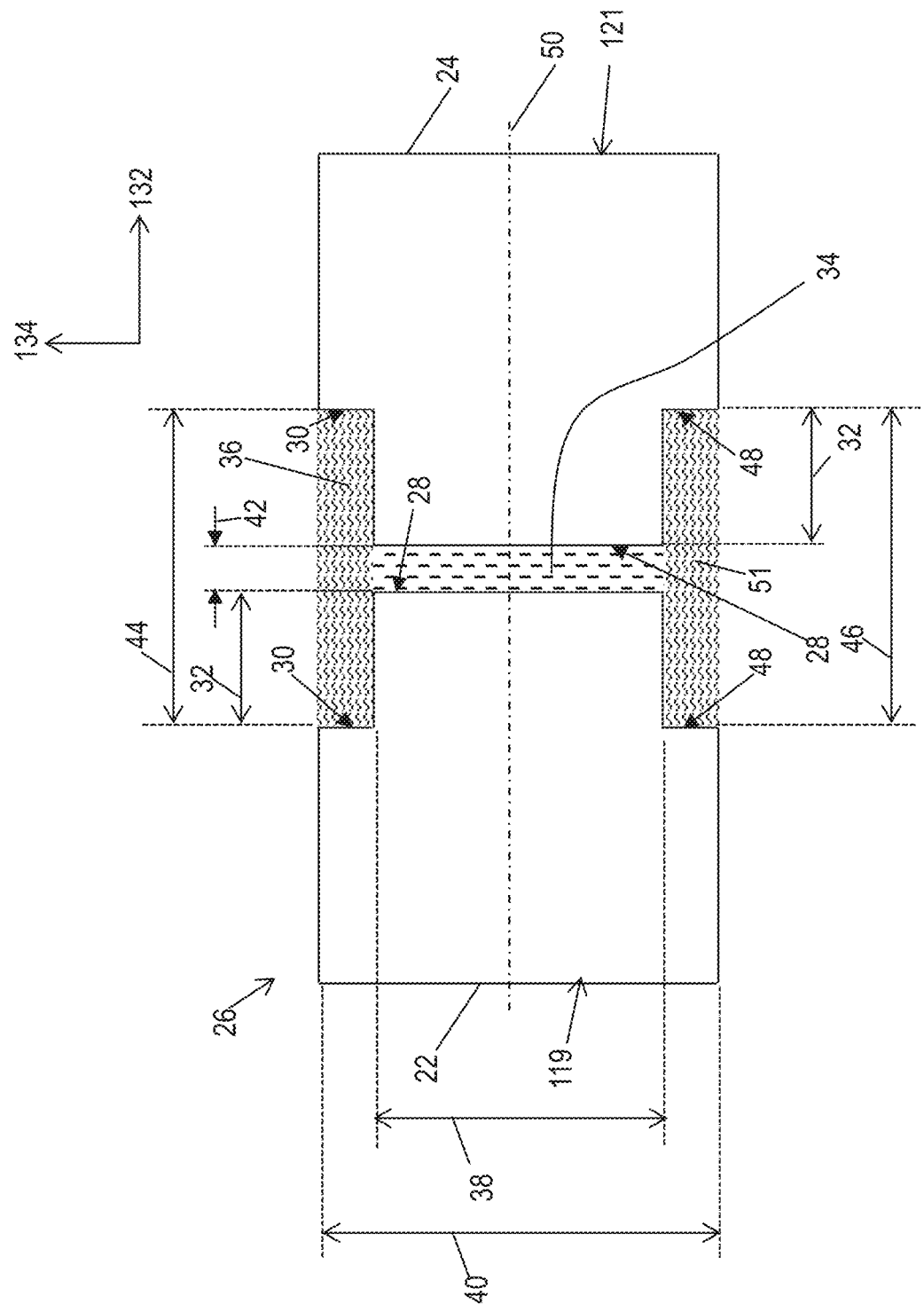
FIG. 1D illustrates a top down view of the embodiment of a shield electrode layer in which multiple capacitive regions are formed according to aspects of the present disclosure.
Figure 1E:
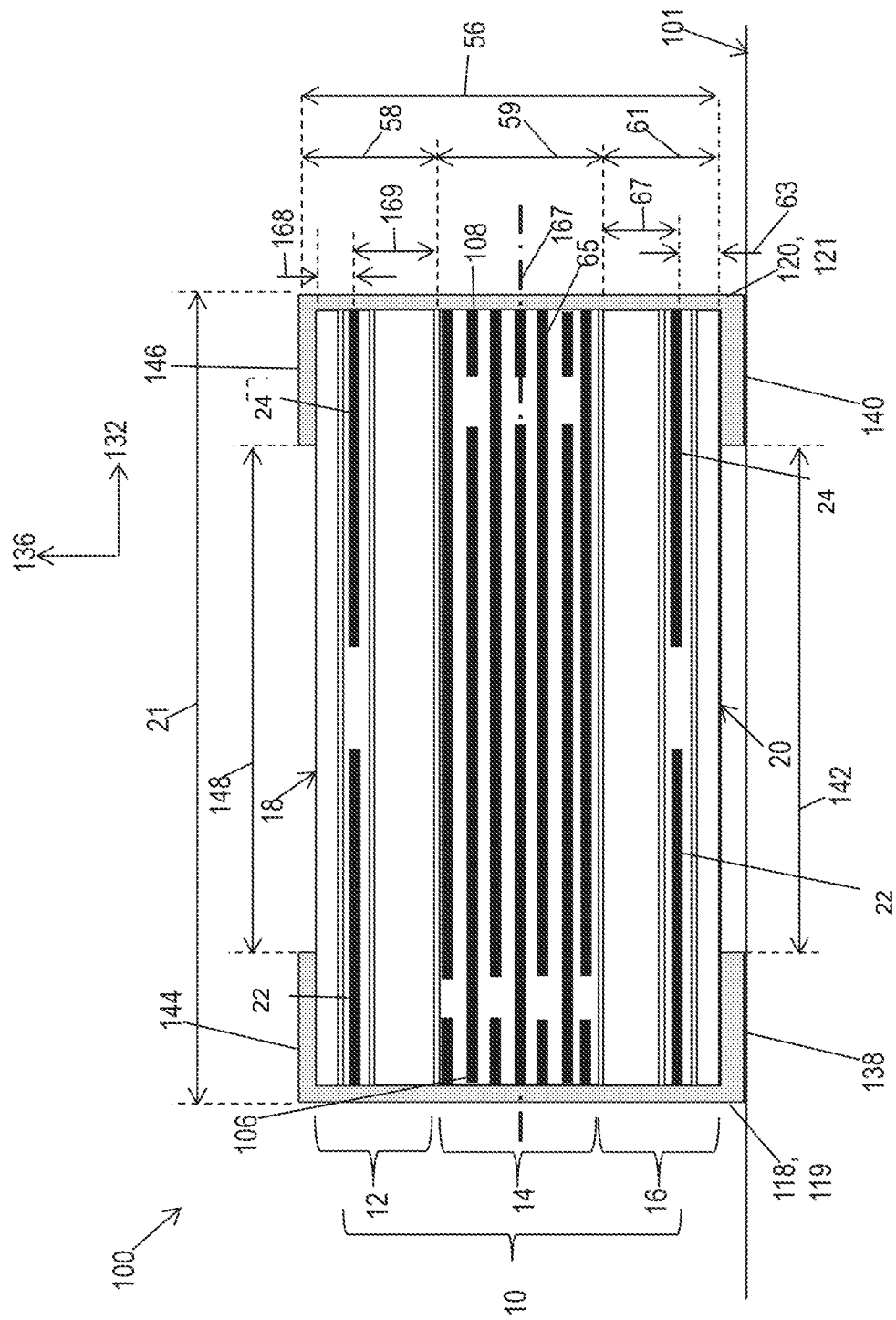
FIG. 1E illustrates a side cross sectional view of one embodiment of a capacitor including multiple regions in which active electrode layers are configured as shown in FIGS. 1A through 1C and a shield electrode layer is configured as shown in FIG. 1C according to aspects of the present disclosure.

Turning to FIGS. 1A-1E, one embodiment of a multilayer ceramic capacitor 100 is disclosed. FIG. 1E is a simplified side elevation view of the multilayer capacitor 100 mounted to a mounting surface 101, such a printed circuit board or substrate. The multilayer capacitor 100 may include a plurality of electrode regions 10 that are stacked in the Z-direction 136. The plurality of electrode regions 10 may include an active electrode region 14, a top shield electrode region 12 and a bottom shield electrode region 16. The active electrode region 14 may be located between the top shield electrode region 12 and the second electrode region 16.

In some embodiments, the capacitor 100, or a portion thereof, may be symmetric about a longitudinal centerline 167 that extends in the longitudinal direction. For example, the shield electrodes 22, 24 of the top shield electrode region 12 may be symmetric about the longitudinal centerline 166 with respect the shield electrodes 22, 24 of the bottom shield electrode region 16. In other words, a shield-to-bottom-surface distance 63, which may be defined between the shield electrodes 22, 24 of the bottom shield electrode region 16 and the bottom surface 20 of the capacitor 100, may be approximately equal to a shield-to-top-surface distance 168, which may be defined between the shield electrodes 22, 24 of the top shield electrode region 12 and the top surface 18 of the capacitor 100. For example, in some embodiments, a ratio of the shield-to-bottom-surface distance 63 to the shield-to-top-surface distance 168 may range from about 0.8 to about 1.2.

The electrode regions 10 may include a plurality of dielectric layers. Some dielectric layers may include electrode layers formed thereon. In general, the thickness of the dielectric layers and the electrode layers is not limited and can be any thickness as desired depending on the performance characteristics of the capacitor. For instance, the thickness of the electrode layers can be, but is not limited to, being about 500 nm or greater, such as about 1 μm or greater, such as about 2 μm or greater, such as about 3 μm or greater, such as about 4 μm or greater to about 10 μm or less, such as about 5 μm or less, such as about 4 μm or less, such as about 3 μm or less, such as about 2 μm or less. For instance, the electrode layers may have a thickness of from about 1 μm to about 2 μm. In addition, in one embodiment, the thickness of the dielectric layer may be defined according to the aforementioned thickness of the electrode layers. Also, it should be understood that such thicknesses of the dielectric layers may also apply to the layers between any active electrode layers, and/or shield electrode layers, when present and as defined herein.

In general, the present invention provides a multilayer capacitor having a unique electrode arrangement and configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{-z}$ (z can be a value from 0 to 1). In one particular embodiment, the dielectric layers may comprise a titanate.

The electrode layers may be formed from any of a variety of different metals as is known in the art. The electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. The electrodes may also be made of a low resistive material, such as silver, copper, gold, aluminum, palladium, etc. In one particular embodiment, the electrode layers may comprise nickel or an alloy thereof.

Referring again to FIG. 1E, in some embodiments, the plurality of active electrode layers 102, 104 may be arranged within the active electrode region 14. Each active electrode layer 102, 104 may include one or more active electrodes, for example as described below with reference to FIGS. 1A through 1C. For example, in some embodiments each active electrode layer 102, 104 may include a first electrode 106 and a second (counter) electrode 108.

The bottom shield electrode region 16 may include one or more shield electrodes, for example as described below with reference to FIG. 1D. For example, the bottom shield electrode region 16 may include a first shield electrode 22 arranged within a monolithic body of the capacitor 100. The first shield electrode 22 may be parallel with the longitudinal direction 132. The first shield electrode 22 may be connected with a first external terminal 118. The bottom shield electrode region 16 may include a second shield electrode 24, which may be connected with a second external terminal 120. The second shield electrode 24 may be approximately aligned with the first shield electrode 22 in the Z-direction 136.

The first external terminal 118 may be connected to the first electrode 106 of a first electrode layer 102 and the second (counter) electrode 108 of the second electrode layer 104. The second external terminal 120 may be connected to the first electrode 106 of the second electrode layer 104 and the second (counter) electrode 108 of the first electrode layer 102.

The dielectric material of the monolithic body of the capacitor 100 may be exposed between the bottom portion 138 of the first external terminal 118 and the bottom portion 140 of the second external terminal 120 along the bottom surface 20 of the capacitor 100. Similarly, the dielectric material of the monolithic body of the capacitor 100 may be exposed between the top portion 144 of the first external terminal 118 and the top portion 146 of the second external terminal 120.

In general, regarding embodiments discussed herein, the external terminals may be formed from any of a variety of different metals as is known in the art. External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

In one embodiment, the external terminals may be formed such that the external terminals are relatively thick. For instance, such terminals may be formed by applying a thick film stripe of a metal to exposed portions of electrode layers (e.g., by dipping the capacitor in a liquid external terminal material). Such metal may be in a glass matrix and may include silver or copper. As an example, such strip may be printed and fired onto the capacitor. Thereafter, additional plating layers of metal (e.g., nickel, tin, solder, etc.) may be created over the termination strips such that the capacitor is solderable to a substrate. Such application of thick film stripes may be conducted using any method generally known in the art (e.g., by a termination machine and printing wheel for transferring a metal-loaded paste over the exposed electrode layers).

The thick-plated external terminals may have an average thickness of about 150 μm or less, such as about 125 μm or less, such as about 100 μm or less, such as about 80 μm or less. The thick-plated external terminals may have an average thickness of about 25 μm or more, such as about 35 μm or more, such as about 50 μm or more, such as about 75 or more μm. For instance, the thick-plated external terminals may have an average thickness of from about 25 μm to about 150 μm, such as from about 35 μm to about 125 μm, such as from about 50 μm to about 100 μm.

In another embodiment, the external terminals may be formed such that the external terminal is a thin-film plating of a metal. Such thin-film plating can be formed by depositing a conductive material, such as a conductive metal, on an exposed portion of an electrode layer. For instance, a leading edge of an electrode layer may be exposed such that it may allow for the formation of a plated termination.

The thin-plated external terminals may have an average thickness of about 50 μor less, such as about 40 μm or less, such as about 30 μm or less, such as about 25 μm or less. The thin-plated external terminals may have an average thickness of about 5 μm or more, such as about 10 μm or more, such as about 15 μm or more. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective electrode layers within a set of alternating dielectric layers and electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the electrode layers of the capacitor. For instance, when the electrode layer comprises nickel and the activation dopant comprises palladium, the palladium dopant may be introduced into the nickel ink or composition that forms the electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal may include at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as a barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the electrode layers. Such phenomena may be referred to as "self-determining" because the formation of the external plated terminals is determined by the configuration of the exposed conductive metal of the electrode layers at the selected peripheral locations on the capacitor. In some embodiments, the capacitor may include "dummy tabs" to provide exposed conductive metal along portions of the monolithic body of the capacitor that does not include other electrodes (e.g., active or shield electrodes).

It should be appreciated that additional technologies for forming capacitor terminals may also be within the scope of the present technology. Exemplary alternatives include, but are not limited to, formation of terminations by plating, magnetism, masking, electrophoretics/electrostatics, sputtering, vacuum deposition, printing or other techniques for forming both thick-film or thin-film conductive layers.

FIG. 1A illustrates a top view of one embodiment of an active electrode configuration for one or more electrodes in the active electrode region 14 according to aspects of the present disclosure. More specifically, the active electrode region 14 may include first electrode layers 102 and second electrode layers 104 in an alternating arrangement, for example as described below with reference to FIG. 1B. Referring to FIG. 1A, each electrode layer 102, 104 may include a first electrode 106 and a second electrode 108. The first electrode 106 may have a base portion 114 that extends along a longitudinal edge of the first electrode 106 in the lateral direction 134. The first electrode 106 may have a pair of electrode arms 110 extending from a base portion 114 in the longitudinal direction 132. The second electrode 108 may have a base portion 114 that extends along a longitudinal edge of the second electrode layer 108 in the lateral direction 134. The second electrode 10 may have a pair of electrode arms 110 extending from the base portion 114 in the longitudinal direction 132.

The electrode arm(s) 110 of the first electrode 106 may be generally longitudinally aligned with respective the electrode arm(s) 110 of the second electrode 108. Arm gap(s) 226 may be defined in the longitudinal direction 132 between aligned electrode arms 110 of the first and second electrodes 106, 108.

A central edge gap distance 23a may be defined in the lateral direction 134 between the central portion 112 of the first electrode and the second electrode arm 110. A central end gap distance 23b may be defined in the longitudinal direction 132 between the central portion 122 of the first electrode 106 and the base portion 114 of the second electrode 108. In some embodiments, the central edge gap distance 23a may be approximately equal to the central end gap distance 23b.

The central portion 112 of the first electrode 106 may have a first width 27 at a first location and a second width 29 at a second location that is greater than the first width 27. The first location of the first width 27 may be offset from the second location of the second width in the longitudinal direction 132. Such a configuration may allow for adjustment of an overlapping area between central portions 112 of adjacent electrodes in the Z-direction 136 without changing the central edge gap distance 23.

Referring to FIG. 1B, a plurality of first electrode layers 102 and a plurality of second electrode layers 104 may be arranged in an alternating, mirrored configuration. As illustrated, the central portions 112 of the respective electrode layers at least partially overlap. FIG. 1B illustrates a total of four electrode layers; however, it should be understood that any number of electrode layers may be employed to obtain the desired capacitance for the desired application.

Referring to FIG. 1C, several capacitive regions may be formed between the first electrode 106 and the second electrode 108. For example, in some embodiments, a central capacitive region 122 may be formed between the central portion 112 of the first electrode 106 and the base portion 114 and/or arms 128 of the second electrode 108. In some embodiments, an arm gap capacitive region 124 may be formed within the arm gap 226 between the electrode arms 110 of the first electrode 106 and the second electrode 108.

FIG. 1D illustrates a shield electrode layer 26. One or more shield electrode layers 26 may be included within the top shield electrode region 12 and/or within bottom shield electrode region 16 (illustrated in FIG. 1E) within the monolithic body of the capacitor 100. As indicated above, the first shield electrode 22 may be parallel with the longitudinal direction 132 (e.g., parallel with the top and bottom surfaces 18, 20 illustrated in FIG. 1E). The first shield electrode 22 may have a first longitudinal edge 28 aligned with the lateral direction 134 and facing away from the first external terminal 118 (shown in FIG. 1E) and first end 119. The first shield electrode 22 may have a second longitudinal edge 30 aligned with the lateral direction 134 and facing away from the first external terminal (shown in FIG. 1E) and first end 119. The second longitudinal edge 30 may be offset in the longitudinal direction 132 from the first longitudinal edge 28 by a shield electrode offset distance 32.

The second shield electrode 24 may be connected with the second external terminal 120 (illustrated in FIG. 1E) and the second end 121. The second shield electrode 24 may be approximately aligned with the first shield electrode 22 in the Z-direction 136 (illustrated in FIG. 1E). The second shield electrode 24 may have a similar configuration to the first shield electrode 22. For example, the second shield electrode 24 may have a first longitudinal edge 28 aligned with the lateral direction 134 and facing away from the second external terminal 120 (illustrated in FIG. 1E) and second end 121. The second shield electrode 24 may have a second longitudinal edge 30 aligned with the lateral direction 134 and facing away from the second external terminal 120 (illustrated in FIG. 1E) and second end 121. The second longitudinal edge 30 of the second shield electrode 24 may be offset from the first longitudinal edge 28 of the second shield electrode 24 by the shield electrode offset distance 32 in the longitudinal direction 132.

A first shield capacitive region 34 may be formed between the first longitudinal edges 28 of the first and second shield electrodes 22, 24. A second shield capacitive region 36 may be formed between the second longitudinal edges 30 of the first and second shield electrodes 22, 24. In some embodiments, a width 38 of the first longitudinal edge 28 in the lateral direction 134 may be less than a width 40 of the first shield electrode 22 in the lateral direction 134.

A first shield gap distance 42 may be formed in the longitudinal direction 132 between the first longitudinal edge 28 of the first shield electrode 22 and the first longitudinal edge 28 of the second shield electrode 24. A second shield gap distance 44 may be formed in the longitudinal direction 132 between the second lateral edge 30 of the first shield electrode 22 and the second lateral edge 30 of the second shield electrode 22.

In some embodiments, a third shield gap distance 46 may be formed between a third longitudinal edge 48 of the first shield electrode 22 and a third longitudinal edge 48 of the second shield electrode 24. A third shield capacitive region 51 may be formed between the third longitudinal edges 48 of the first and second shield electrodes 119, 121. In some embodiments, the third shield gap distance 46 may be approximately equal to the second shield gap distance 44 such that the third shield capacitive region 51 may be substantially similar in size and shape to the second shield capacitive region 36. For example, in some embodiments the first shield electrode 22 and/or second shield electrode 24 may be symmetric about a longitudinal centerline 50 that extends in the longitudinal direction 132.

In other embodiments, however, the third shield gap distance 46 may be greater than or less than the second shield gap distance 44 such that the third capacitive region 51 is differently sized and/or shaped than the second capacitive region 36 and produces a different capacitance than the second capacitive region.

It should be understood that, in some embodiments, one or more of the shield electrodes 22, 24 may be rectangular. In other words, the shield electrode offset distance 32 may be zero or approximately zero such that the first longitudinal edge 28 and second longitudinal edge 30 are aligned or approximately aligned.

Figure 2A:
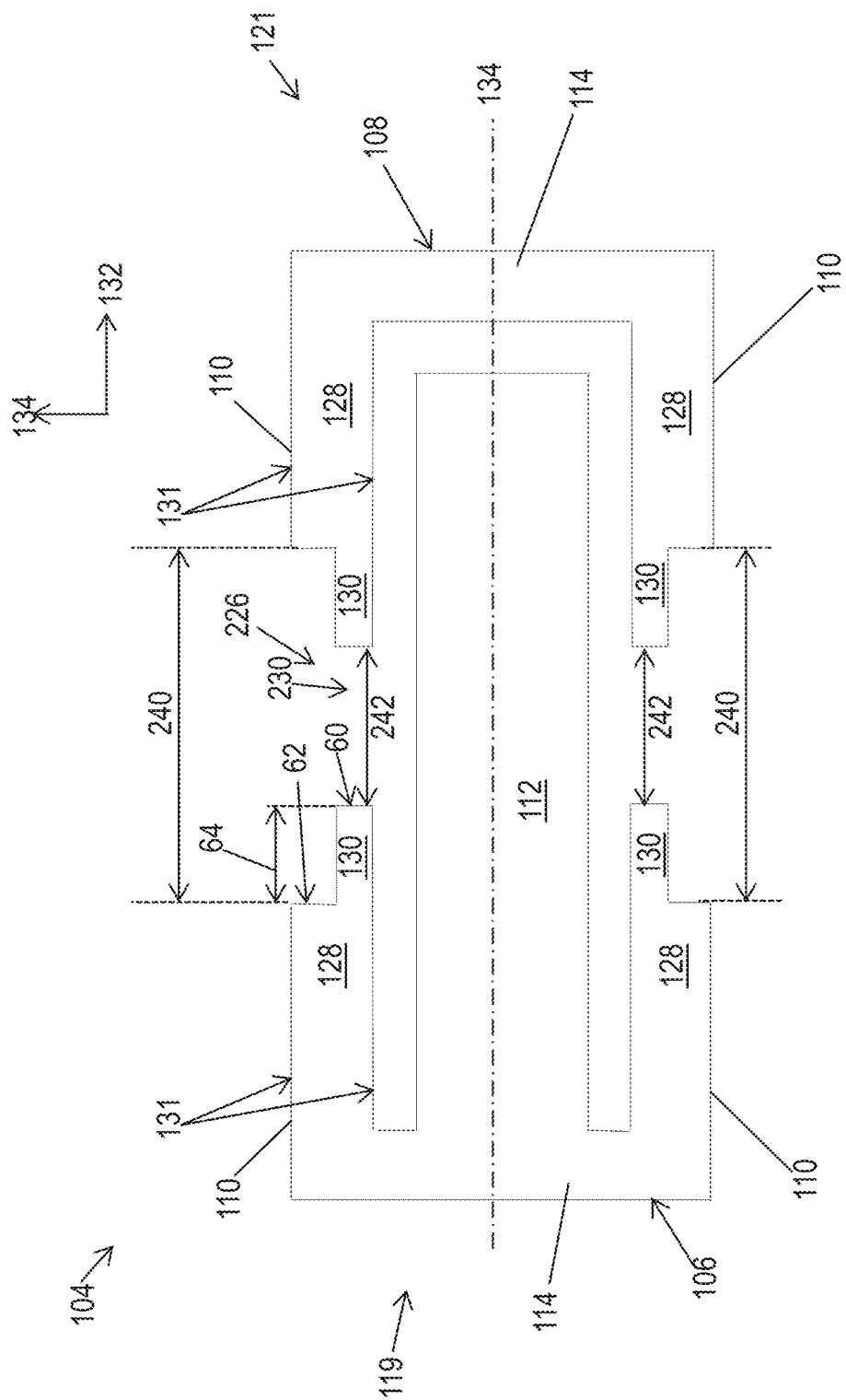
FIG. 2A illustrates a top view of another embodiment of an active electrode layer according to aspects of the present disclosure.
Figure 2B:
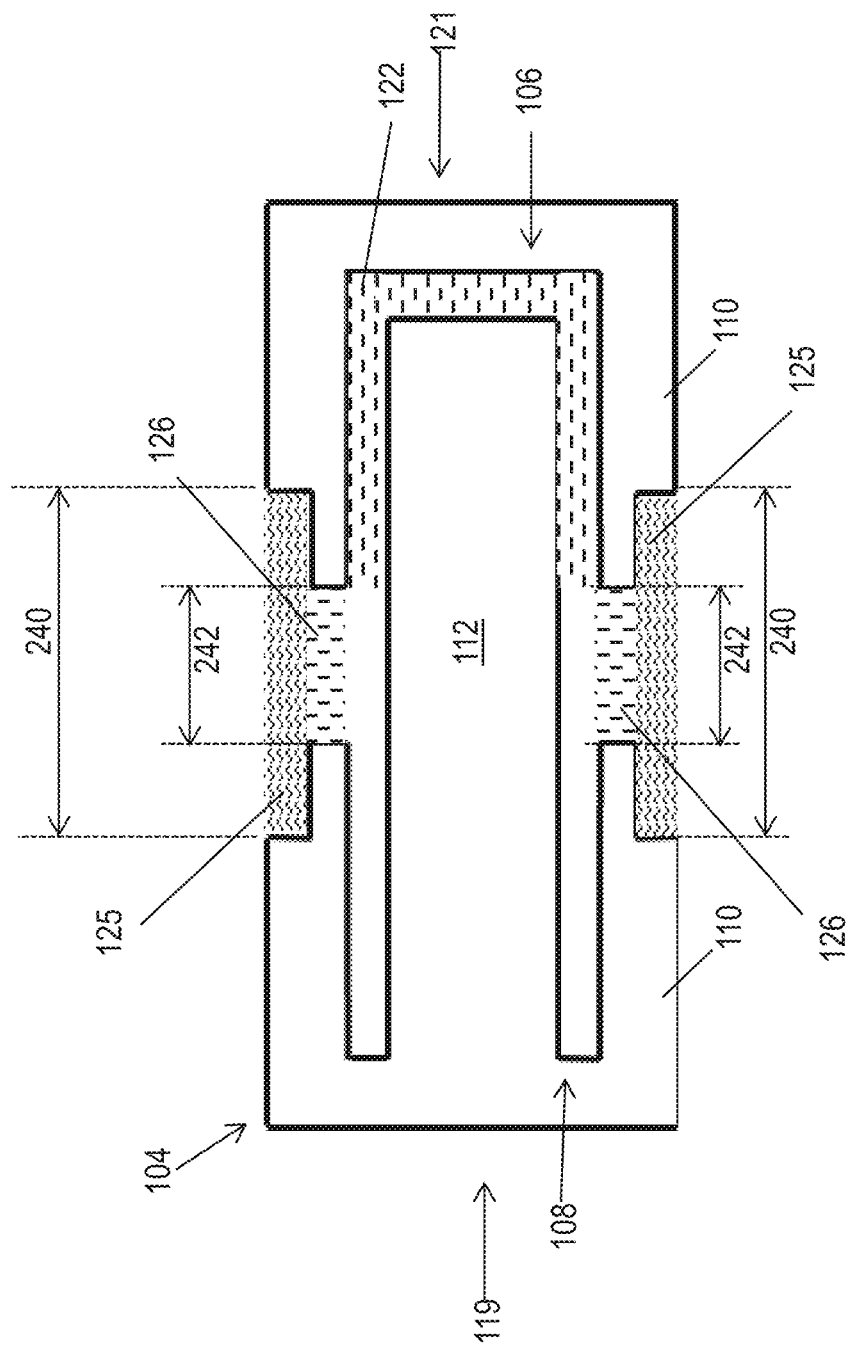
FIG. 2B illustrates a top down view of the embodiment of the active electrode layer of FIG. 2A in which multiple capacitive regions are formed according to aspects of the present disclosure.
Figure 2C:
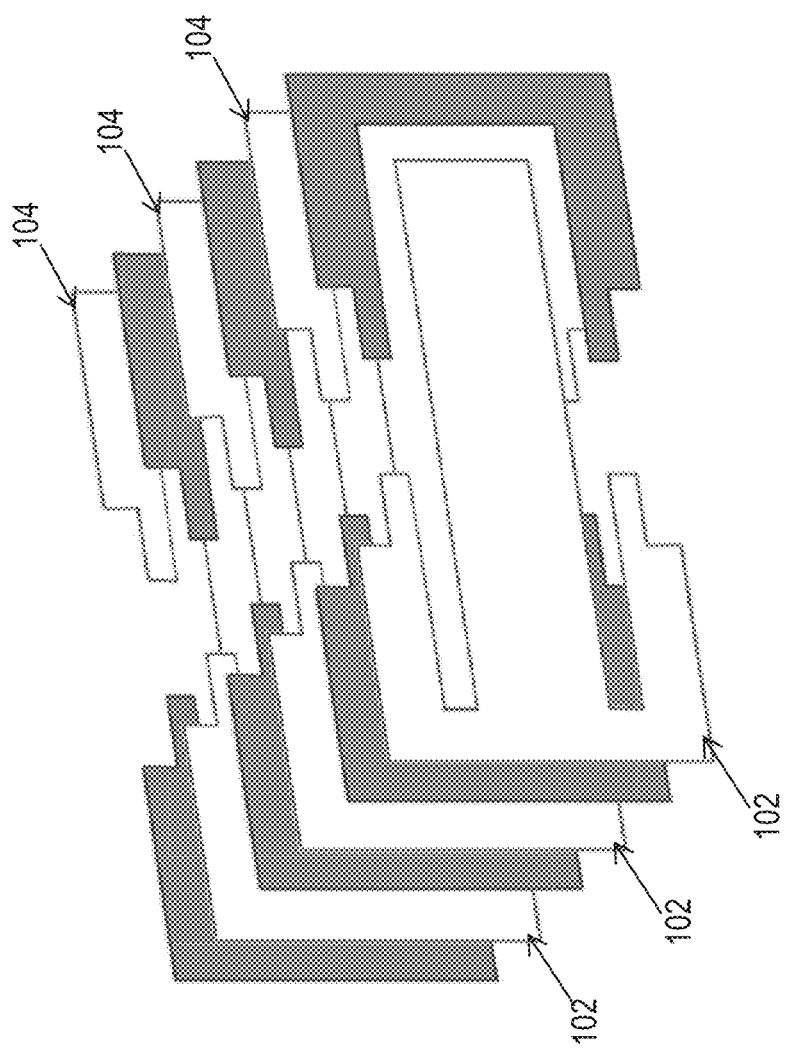
FIG. 2C illustrates a perspective view of alternating electrode layers configured as shown in FIG. 2A according to aspects of the present disclosure.

FIGS. 2A and 2B illustrate another embodiment of the first and second electrode layers 102, 104. More specifically, each electrode layer 102, 104 may include a first electrode 106 and a second electrode 108. The first electrode 106 may have a base portion 114. A pair of electrode arms 110 and at least one central portion 112 may extend from the base portion 114. The second electrode 108 may have a base portion 114 that extends along a longitudinal edge of the second electrode layer 108. The second electrode 106 may have a pair of electrode arms 110 extending from the base portion 114. The electrode regions 12, 14, 16 may generally be non-overlapping.

Referring to FIG. 1E, in some embodiments, the broadband multilayer ceramic capacitor 100 may have a capacitor thickness 56 in the Z-direction 136 between the top surface 18 and the bottom surface 20.

The top shield electrode region 12 may have a first shield electrode region thickness 58 in the Z-direction 136. In some embodiments, a ratio of the capacitor thickness 56 to the first shield electrode region thickness 58 may be less than about 10.

The active electrode region 14 may be an active electrode region thickness 59 in the Z-direction 136. The active electrode region 14 may be free of shield electrodes 22, 24, and/or may include only overlapping electrodes. The active electrode region thickness 59 may be defined between the lowest active electrode layer 19 and a highest active electrode layer 65. A ratio of the capacitor thickness 56 to the active electrode region thickness 59 may range from about 1.1 to about 20.

The bottom shield electrode region 16 may have a second shield electrode region thickness 61 in the Z-direction 136. The shield electrode region thickness 61 may be defined between the bottom surface 20 of the capacitor 100 and a lowest electrode layer 19 of the plurality of active electrodes. A ratio of the capacitor thickness 56 to the shield electrode region thickness 61 may range from about 1.1 to about 20.

In some embodiments, a shield-to-bottom-surface distance 63 may be defined as a distance between the shield electrodes 22, 24 and the bottom surface 20 of the capacitor 100. If multiple shield electrode layers are included in the bottom shield electrode region 16, the shield-to-bottom-surface distance 63 may be defined as the distance between the lowest of the shield electrode layers and the bottom surface 20. A ratio of the capacitor thickness 56 to the shield-to-bottom-surface distance 63 may greater than about 2.

In some embodiments, the shield electrodes 22, 24 of the top shield electrode region 12 may be spaced apart from the active electrodes 106, 108 by a first shield-to-active distance 169. A ratio of the first shield-to-active distance 169 to the shield-to-bottom-surface distance 63 may range from about 1 to about 20, in some embodiments from about 2 to about 10, and in some embodiments from about 3 to about 5.

The shield electrodes 22, 24 of the bottom shield electrode region 16 may be spaced apart from the active electrodes 106, 108 by a second shield-to-active distance 67. A ratio of the second shield-to-active distance 67 to the shield-to-top-surface distance 168 may range from about 1 to about 20, in some embodiments from about 2 to about 10, and in some embodiments from about 3 to about 5. Additionally, a ratio of the first shield-to-active distance 169 to the second shield-to-active distance 67 may range from about 0.8 to about 1.2.

In addition, FIG. 2A illustrates electrode arms 110 that include a main portion 128 and a step portion 130. More specifically, an electrode arm 110 of the first electrode 106 may include a first longitudinal edge 60 that extends in the lateral direction 134 and may define an edge of the step portion 130. A second longitudinal edge 62 may extend in the lateral direction 134 and may define an edge of the main portion 128 of the arm 110. The first longitudinal edge 60 may be offset from the second longitudinal edge 62 in the longitudinal direction 132 by an arm offset distance 64. One or both electrode arms 110 of the first electrode 106 and/or second electrode 108 may include respective main and step portions 128, 130. For example both arms 110 of both electrodes 106, 108 may include respective main portions 128 and step portions 130, for example as illustrated in FIG. 2A. Main arm gaps 240 may be formed between the step portions 130 of aligned arms 110. Step arm gaps 242 may be formed between the main portions 128 of aligned arms 110.

Referring to FIGS. 2B, several capacitive regions may be formed between the first electrode 106 and the second electrode 108 of the electrode configuration of FIG. 2A. For example, in some embodiments, a central capacitive region 122 may be formed between the central portion 112 of the first electrode 106 and the base portion 114 and/or arms 110 of the second electrode 108. In some embodiments, a main arm gap capacitive region 125 may be formed within the main arm gap 240, and a step gap capacitive region 126 may be formed within the step arm gap 242.

Figure 3:
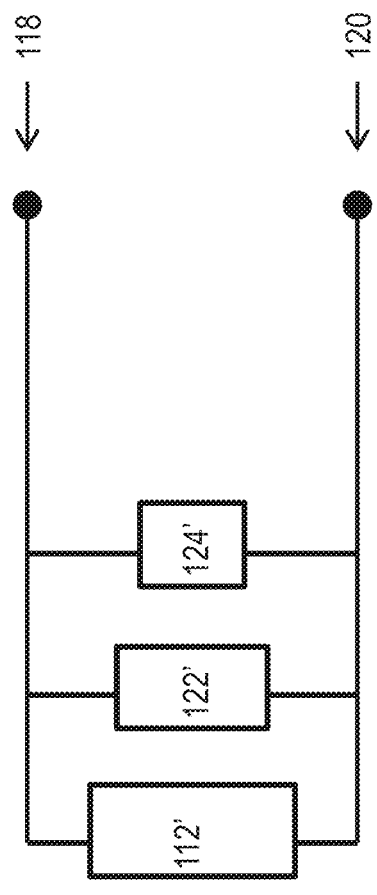
FIG. 3 depicts a circuit schematic representation of the embodiment of a capacitor illustrated in FIGS. 1A through 1E with multiple capacitive regions.

FIG. 3 schematically illustrates three capacitive elements of the electrode configuration of FIG. 1C: a primary capacitive element 112' between adjacent electrode layers, a central capacitive element 122', and an arm gap capacitive element 124'. The capacitive elements 112', 122' and 124' correspond with the central area 112, central capacitive region 122 and arm gap capacitive region 124, respectively of FIG. 1C. In addition, external terminals are depicted as 118 and 128 in FIG. 4.

Figure 4:
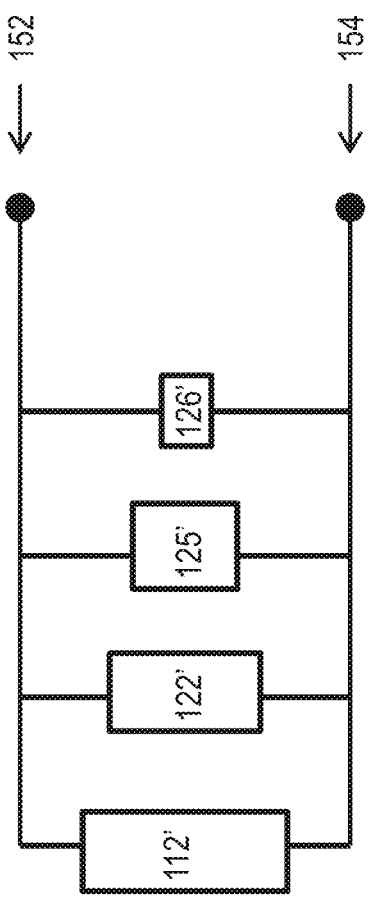
FIG. 4 depicts a circuit schematic representation of the embodiment of a capacitor illustrated in FIGS. 2A through 2C with multiple capacitive regions.

FIG. 4, schematically illustrates four capacitive elements of the electrode configuration of FIG. 2B, in which capacitive elements 112', 122' and 125', and 126' correspond with the central area 112, capacitive region 122, main arm gap capacitive region 125, and step gap capacitive region 126, respectively, of FIG. 2B. It should be understood that the dimensions of the various gaps may be selectively designed to achieve desired respective capacitance values for the capacitive elements illustrated in FIGS. 3 and 4. More specifically, the configuration of the capacitor and various parameters such as the number of electrode layers, the surface area of the overlapping central portions of electrode pairs, the distance separating electrodes, the dielectric constant of the dielectric material, etc., may be selected to achieve desired capacitance values. Nevertheless, the capacitor as disclosed herein may include an array of combined series and parallel capacitors to provide effective broadband performance.

In one exemplary ultra-broadband capacitor embodiment, primary capacitor 112' generally corresponds to a relatively large capacitance adapted for operation at a generally lower frequency range, such as on the order of between about several kilohertz (kHz) to about 200 megahertz (MHz), while secondary capacitors 122', 124', 125' and/or 126' may generally correspond to relatively smaller value capacitors configured to operate at a relatively higher frequency range, such as on the order of between about 200 megahertz (MHz) to many gigahertz (GHz).

Thus, the active electrodes may be configured to exhibit a plurality of capacitive elements within a single set of stacked electrodes. For instance, a primary capacitive element may be effective at relatively low frequencies while a secondary capacitive elements (e.g., the central capacitive region 122 and/or arm gap capacitive region 124) may be effective at relatively medium and/or high frequencies. For instance, the primary capacitance may be within 1 and 500 nF, such as within about 10 and 100 nF while the secondary capacitance may be within 1 and 500 pF, such as within 10 and 100 pF.

Figure 5:
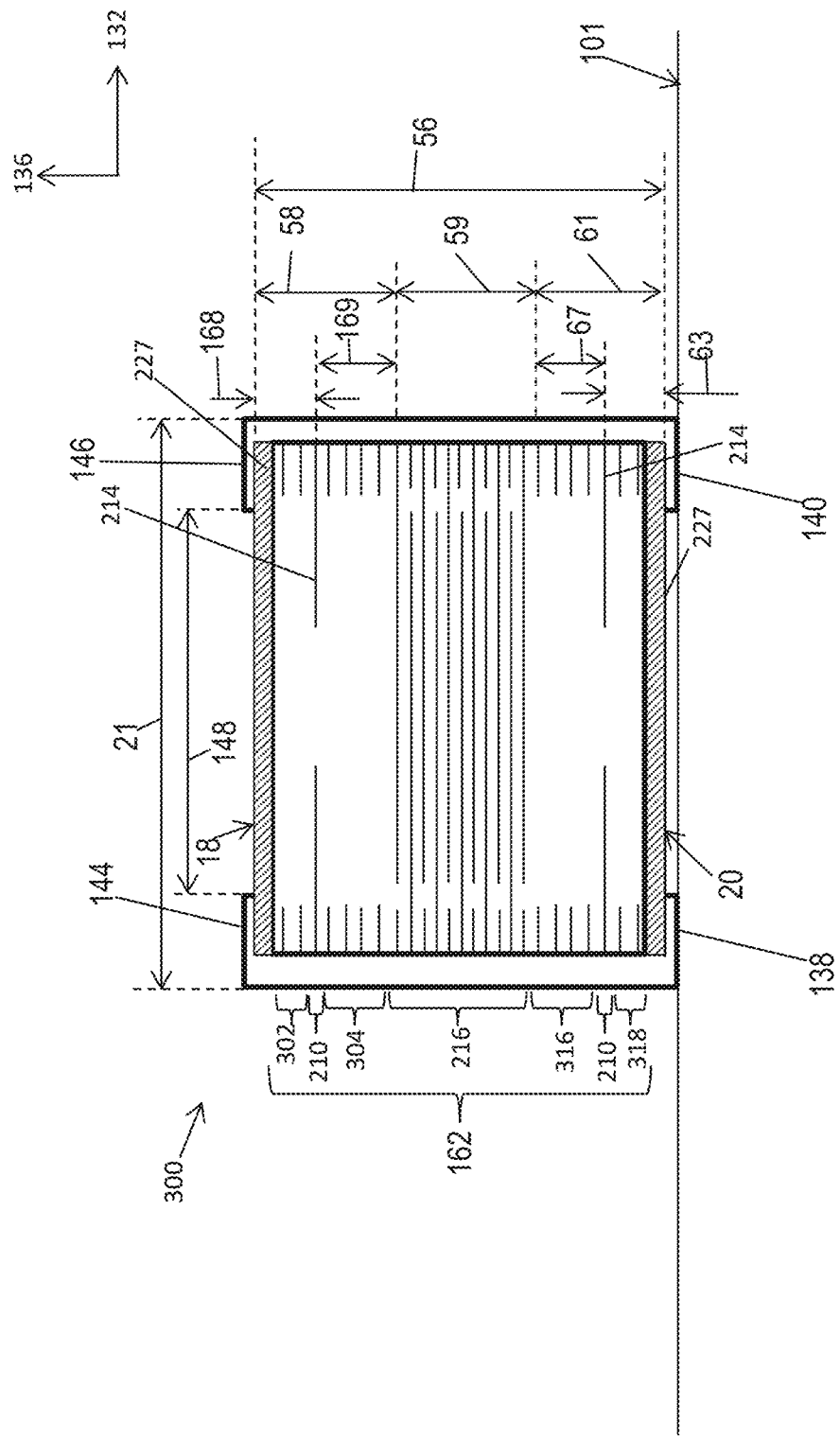
FIG. 5 illustrates a side cross sectional view of one embodiment of a capacitor of the present invention.

Referring to FIG. 5, in some embodiments, the multilayer capacitor 300 may also include anchor electrode regions 302, 304, 316, and/or 318. For example, the multilayer capacitor 300 may include a first anchor electrode region 304 on top of the active electrode region 216. Further, a shield electrode region 210 containing a shield electrode layer 214 may be positioned above, such as on top, of the first anchor electrode region 304. Additionally, a second anchor electrode region 302 may be positioned above, such as on top, of top of the shield electrode region 210. Similarly, the multilayer capacitor 300 may include a third anchor electrode region 316 below, such as immediately below, the active electrode region 216. Further, a shield electrode region 210 containing a shield electrode layer 214 may be positioned below, such as immediately below, the third anchor electrode region 316. Additionally, a fourth anchor electrode region 318 may be positioned below, such as immediately below, the shield electrode region 210. In this regard, the active electrode region 216 may be disposed between the first anchor electrode region 304 and the third anchor electrode region 316, for example. The active electrode region 216 may be configured as described above with reference to FIGS. 1A through 1C, FIGS. 2A through 2C, or as described below with reference to FIGS. 7A through 7D.

Figure 6A:
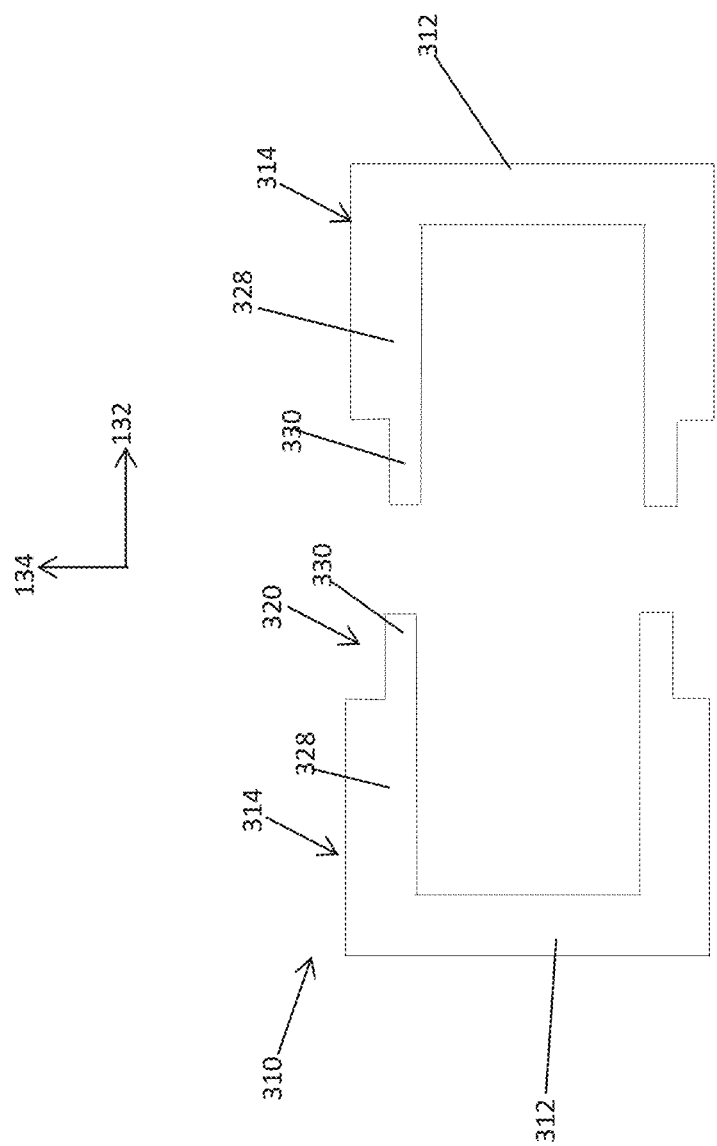

Referring to FIG. 6A, the anchor electrode regions 302, 304, 316, and/or 318 may include a plurality of anchor electrode layers 310, each having a pair of anchor electrodes 312. The anchor electrodes 312 may include a pair of electrode arms 314. Each electrode arm 314 of the anchor electrodes 312 may include a main portion 328 and a step portion 330, for example, in a similar manner as described above with reference to the electrodes of FIGS. 1A and 2.

Figure 6C:
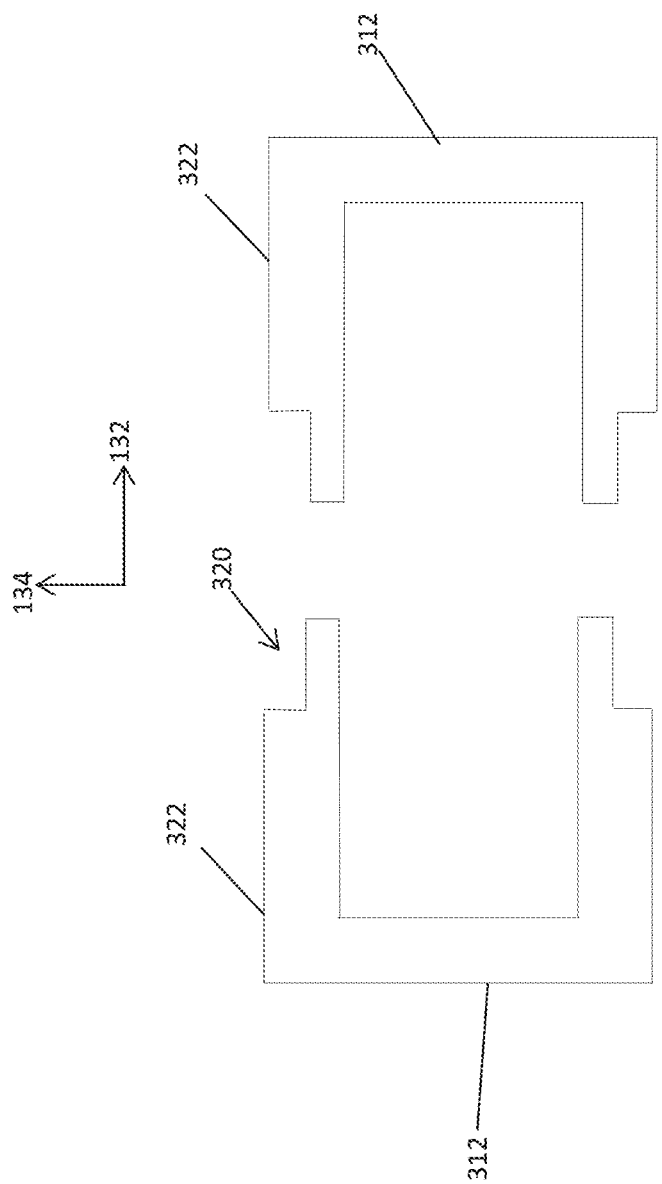

Referring to FIGS. 6B through 6D, the anchor electrodes 312 may have various configurations. For example, referring to FIG. 6B, in some embodiments, the electrode arms 314 of the anchor electrodes 312 may not include a step. For instance, such electrodes may be presented in a C-shaped configuration without a step. Referring to FIG. 6C, in some embodiments, the electrode arms 314 of the anchor electrodes 312 may include a step portion 320 that is inwardly offset from an outer lateral edge 322 of the anchor electrode 312. Referring to FIG. 6D, in other embodiments, the step portion 320 may be offset from an inner lateral edge 324 of the arms 314 of the anchor electrodes 312. Yet other configurations are possible. For example, in some embodiments, the step portion 320 may be offset from both the outer lateral edge 322 and the inner lateral edge 324.

Figure 7A:
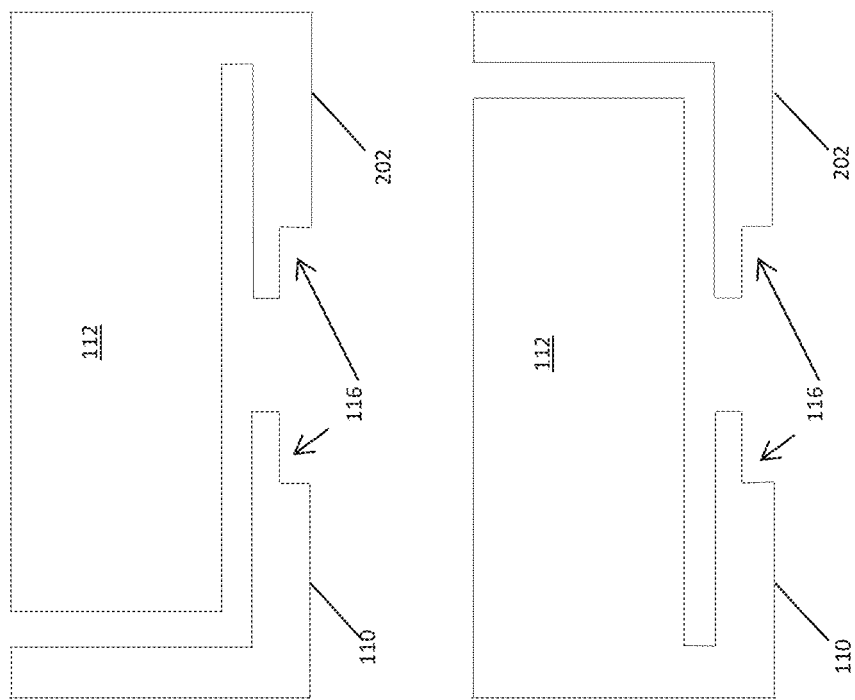
Figure 7B:
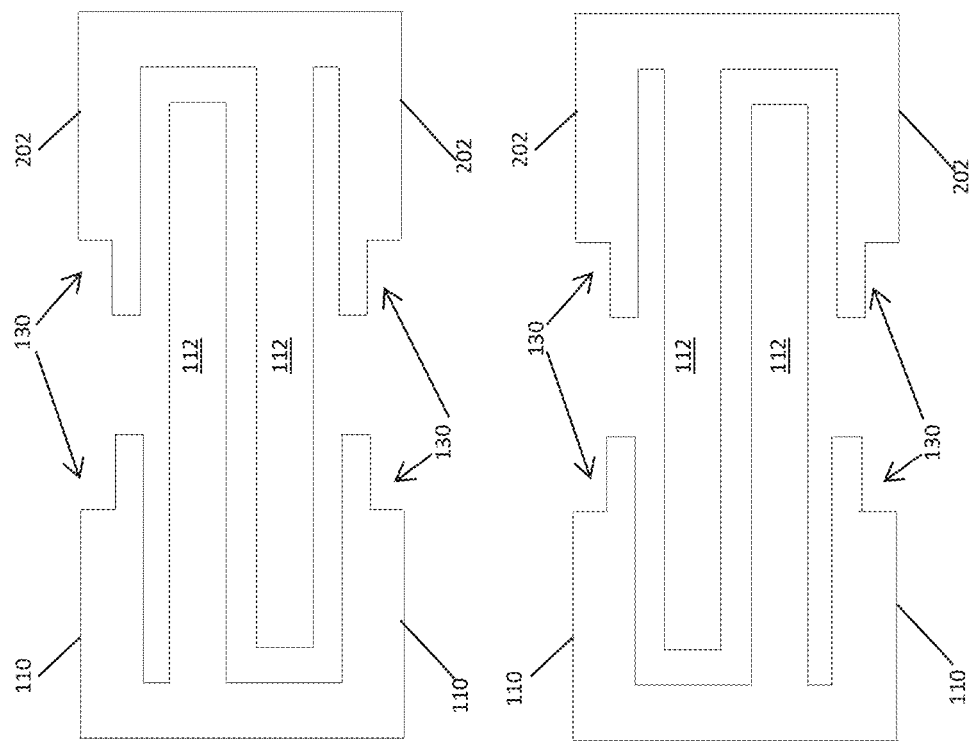
Figure 7C:
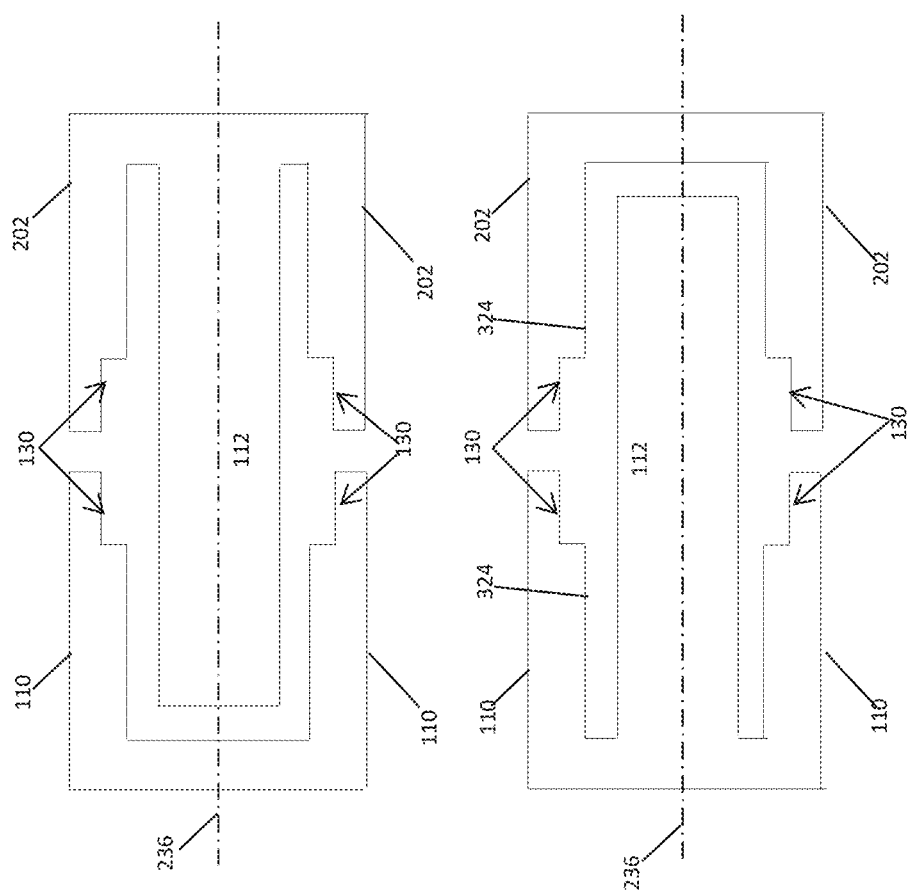

Referring to FIGS. 7A through 7C, in some embodiments, the active electrodes 106, 108 may have various other configurations. For example, referring to FIG. 7A, in some embodiments, each of the first electrodes 106 and second electrodes 108 may include a single arm 110, instead a pair of arms 110, 202 as described above with respect to FIG. 1A. In this regard, such electrodes may include one electrode containing a central portion that extends from a base and one electrode arm that also extends from the base portion; meanwhile, the counter electrode may include a base portion and only one electrode arm extending from the base portion of such second electrode.

Referring to FIG. 7B, in some embodiments, each of the first electrodes 106 and second electrodes 108 may include central portions 112. For instance, each electrode 106, 108 may include a central portion 112 that extends from a respective base portion in addition to at least one electrode arm 110, 202, such as two electrode arms 110, 202, that extend from the respective base portion.

Referring to FIG. 7C, in some embodiments, the electrode arms 110, 202 of the electrodes 106, 108 may have a step portion 130 that is outwardly offset from an inner lateral edge 324 of the main portion of an electrode arm away from a lateral centerline 236 of the at least one of the electrodes 106, 108 of the electrode layers. Lastly, referring to FIG. 7D, in some embodiments, the electrode arms 110 of the electrodes 106, 108 may have step portions 130 that are offset from both the outer lateral edge 322 and the inner lateral edge 324 of the electrode arms 110, 202.

II. Test Methods

A testing assembly can be used to test performance characteristics, such as insertion loss and return loss, of a capacitor according to aspects of the present disclosure. For example, the capacitor can be mounted to a test board. An input line and an output line can each be connected with the test board. The test board can include microstrip lines electrically connecting the input line and output lines with respective external terminations of the capacitor.

An input signal can be applied to the input line using a source signal generator (e.g., a 1806 Keithley 2400 series Source Measure Unit (SMU), for example, a Keithley 2410-C SMU) and the resulting output signal of the capacitor can be measured at the output line (e.g., using the source signal generator). This was repeated for various configurations of the capacitor.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A broadband multilayer ceramic capacitor having a first end and a second end that is spaced apart from the first end in a longitudinal direction that is perpendicular to a lateral direction, the lateral direction and longitudinal direction each being perpendicular to a Z-direction, and wherein the capacitor comprises a top surface and a bottom surface opposite the top surface in the Z-direction, the broadband multilayer ceramic capacitor comprising:

a monolithic body comprising a plurality of dielectric layers stacked in the Z-direction;
   a first external terminal disposed along the first end;
   a second external terminal disposed along the second end;
   a plurality of active electrodes arranged within the monolithic body; and
   a top shield electrode arranged within the monolithic body and positioned between the plurality of active electrodes and the top surface of the capacitor, the top shield electrode being spaced apart from the top surface of the capacitor by a top-shield-to-top distance;
   wherein:
   the top shield electrode is connected with the first external terminal;
   the top shield electrode has a first longitudinal edge aligned with the lateral direction and faces away from the first external terminal;
   the top shield electrode has a second longitudinal edge aligned with the lateral direction and faces away from the first external terminal; and
   the second longitudinal edge is offset in the longitudinal direction from the first longitudinal edge by a shield electrode offset distance.

2. The broadband multilayer ceramic capacitor of claim 1, wherein the capacitor has a capacitor thickness between a top surface and a bottom surface in the Z-direction, and wherein a ratio of the capacitor thickness to the bottom-shield-to-bottom distance is greater than about 3.

3. The broadband multilayer ceramic capacitor of claim 1, wherein:
   the capacitor comprises a plurality of electrode regions, the plurality of electrode regions including an active electrode region, a top shield electrode region, and a bottom shield electrode region;
   the plurality of active electrodes are located within the active electrode region;
   the top shield electrode is located within the top shield electrode region; and
   the bottom shield electrode is located within the bottom shield electrode region.

4. The broadband multilayer ceramic capacitor of claim 3, wherein a ratio of a thickness of the top shield electrode region in the Z-direction to a thickness of the bottom shield electrode region in the Z-direction ranges from about 0.8 to about 1.2.

5. The broadband multilayer ceramic capacitor of claim 3, wherein:
   the capacitor has a capacitor thickness in the Z-direction between the top surface and the bottom surface; and
   a ratio of the capacitor thickness to a thickness of the top shield electrode region in the Z-direction ranges from about 2.1 to about 20.

6. The broadband multilayer ceramic capacitor of claim 3, wherein:
   the capacitor has a capacitor thickness in the Z-direction between the top surface and the bottom surface; and
   a ratio of the capacitor thickness to an active electrode region thickness ranges from about 1.1 to about 20.

7. The broadband multilayer ceramic capacitor of claim 1, further comprising an additional top shield electrode that is approximately aligned with the top shield electrode in the Z-direction, wherein the additional top shield electrode is connected with the second external terminal, and wherein:
   the additional top shield electrode has a first longitudinal edge aligned with the lateral direction and facing away from the second external terminal;

the additional top shield electrode has a second longitudinal edge aligned with the lateral direction and facing away from the second external terminal; and the second longitudinal edge is offset in the longitudinal direction from the first longitudinal edge by approximately the shield electrode offset distance.

8. The broadband multilayer ceramic capacitor of claim 7, wherein a first shield gap distance is formed in the longitudinal direction between the first longitudinal edge of the top shield electrode and the first longitudinal edge of the additional top shield electrode.

9. The broadband multilayer ceramic capacitor of claim 8, wherein the capacitor has a capacitor length in the longitudinal direction between the first end and the second end of the capacitor, and wherein a ratio of the capacitor length to the first shield gap distance is greater than about 2.

10. The broadband multilayer ceramic capacitor of claim 7, wherein a second shield gap distance is formed in the longitudinal direction between the second longitudinal edge of the top shield electrode and the second longitudinal edge of the additional top shield electrode.

11. The broadband multilayer ceramic capacitor of claim 10, wherein the capacitor has a capacitor length in the longitudinal direction between the first end and the second end of the capacitor, and wherein a ratio of the capacitor length to the second shield gap distance is greater than about 2.

12. The broadband multilayer ceramic capacitor of claim 1, further comprising a bottom shield electrode arranged within the monolithic body and positioned between the plurality of active electrodes and the bottom surface of the capacitor, wherein:
the bottom shield electrode is connected with the first external terminal;
the bottom shield electrode has a first longitudinal edge aligned with the lateral direction and faces away from the first external terminal;
the bottom shield electrode has a second longitudinal edge aligned with the lateral direction and faces away from the first external terminal; and
the second longitudinal edge is offset in the longitudinal direction from the first longitudinal edge by a shield electrode offset distance.

13. The broadband multilayer ceramic capacitor of claim 12, further comprising an additional bottom shield electrode that is connected with the second external terminal and approximately aligned with the bottom shield electrode in the Z-direction, and wherein:
the additional bottom shield electrode has a first longitudinal edge aligned with the lateral direction and facing away from the second external terminal;
the additional bottom shield electrode has a second longitudinal edge aligned with the lateral direction and facing away from the second external terminal; and
the second longitudinal edge is offset in the longitudinal direction from the first longitudinal edge by approximately the shield electrode offset distance.

14. The broadband multilayer ceramic capacitor of claim 1, wherein:
at least one of the active electrode layers comprises a first electrode and a second electrode approximately aligned with the first electrode in the Z-direction, the first electrode comprising (i) a base portion electrically connected with the first external terminal, (ii) a first electrode arm extending from the base portion in the longitudinal direction, and (iii) a central portion extending from the base portion in the longitudinal direction, the second electrode comprising a base portion electrically connected with the second external terminal; and a central end gap distance is formed in the longitudinal direction between the central portion of the first electrode and the base portion of the second electrode.

15. The broadband multilayer ceramic capacitor of claim 1, wherein the capacitor exhibits an insertion loss of from −0.25 dB to −0.55 dB when measured across a frequency range of from 33 GHz to 40 GHz.

16. The broadband multilayer ceramic capacitor of claim 1, wherein the capacitor exhibits an insertion loss of from −0.20 dB to −0.35 dB when measured across a frequency range of from 23 GHz to 30 GHz.

17. The broadband multilayer ceramic capacitor of claim 1, wherein the capacitor exhibits an insertion loss of from −0.15 dB to −0.40 dB when measured across a frequency range of from 13 GHz to 20 GHz.

18. The broadband multilayer ceramic capacitor of claim 1, wherein the capacitor exhibits an insertion loss of from −0.1 dB to −0.25 dB when measured across a frequency range of from 4 GHz to 10 GHz.

19. A broadband multilayer ceramic capacitor having a first end and a second end that is spaced apart from the first end in a longitudinal direction that is perpendicular to a lateral direction, the lateral direction and longitudinal direction each being perpendicular to a Z-direction, and wherein the capacitor comprises a top surface and a bottom surface opposite the top surface in the Z-direction, the broadband multilayer ceramic capacitor comprising:
a monolithic body comprising a plurality of dielectric layers stacked in the Z-direction;
a first external terminal disposed along the first end;
a second external terminal disposed along the second end;
a plurality of active electrodes arranged within the monolithic body;
a top shield electrode arranged within the monolithic body and positioned between the plurality of active electrodes and the top surface of the capacitor, the top shield electrode being spaced apart from the top surface of the capacitor by a top-shield-to-top distance, the top shield electrode being spaced apart from the plurality of active electrodes by a first shield-to-active distance; and
a bottom shield electrode arranged within the monolithic body and positioned between the plurality of active electrodes and the bottom surface of the capacitor, the bottom shield electrode being spaced apart from the bottom surface of the capacitor by a bottom-shield-to-bottom distance;
wherein a ratio of the first shield-to-active distance to the bottom-shield-to-bottom distance is within a range of about 1 to about 20.

20. A broadband multilayer ceramic capacitor having a first end and a second end that is spaced apart from the first end in a longitudinal direction that is perpendicular to a lateral direction, the lateral direction and longitudinal direction each being perpendicular to a Z-direction, and wherein the capacitor comprises a top surface and a bottom surface opposite the top surface in the Z-direction, the broadband multilayer ceramic capacitor comprising:
a monolithic body comprising a plurality of dielectric layers stacked in the Z-direction;
a first external terminal disposed along the first end;
a second external terminal disposed along the second end;
a plurality of active electrode layers arranged within the monolithic body;

a top shield electrode layer arranged within the monolithic body and positioned between the plurality of active electrode layers and the top surface of the capacitor, the top shield electrode layer including a first top shield electrode and a second top shield electrode approximately aligned with the first top shield electrode in the Z-direction; and a bottom shield electrode arranged within the monolithic body and positioned between the plurality of active electrodes and the bottom surface of the capacitor, the bottom shield electrode layer including a first bottom shield electrode and a second bottom shield electrode approximately aligned with the first bottom shield electrode in the Z-direction;

wherein at least one of the first top shield electrode, the second top shield electrode, the first bottom shield electrode, and the second bottom shield electrode is non-rectangular in shape.

21. The broadband multilayer ceramic capacitor of claim 20, wherein the first bottom shield electrode is non-rectangular in shape, and wherein at least two shield capacitive regions are defined between the first bottom shield electrode and the second bottom shield electrode.

* * * * *